(12) United States Patent
Nonaka

(10) Patent No.: US 7,600,203 B2
(45) Date of Patent: Oct. 6, 2009

(54) CIRCUIT DESIGN SYSTEM AND CIRCUIT DESIGN PROGRAM

(75) Inventor: Junpei Nonaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 319 days.

(21) Appl. No.: 11/588,372

(22) Filed: Oct. 27, 2006

(65) Prior Publication Data

US 2007/0113127 A1    May 17, 2007

(30) Foreign Application Priority Data

Oct. 28, 2005    (JP)    ............................. 2005-313953

(51) Int. Cl.
    G06F 17/50    (2006.01)
(52) U.S. Cl. .......................................... 716/4
(58) Field of Classification Search .................. 716/14, 716/15
    See application file for complete search history.

(56) References Cited

U.S. PATENT DOCUMENTS

| 5,638,380 | A | * | 6/1997 | De ............................. 714/726 |
| 6,072,179 | A | | 6/2000 | Paniccia et al. |
| 6,311,317 | B1 | * | 10/2001 | Khoche et al. ................ 716/18 |
| 6,915,494 | B2 | * | 7/2005 | Shigeta ......................... 716/4 |

FOREIGN PATENT DOCUMENTS

JP    2001-14370    1/2001
JP    2002-522770    7/2002

OTHER PUBLICATIONS

Goundan et al., "Design of Totally Fault Locatable Combinational Networks", IEEE Transactions on Computers, pp. 33-44, Jan. 1980.*
I. Pomeranz et al., "Z-DFD: Design-For-Diagnosability Based on the Concept of Z-Detection", Proceedings of International Test Conference 2004, Nov. 2004.
T. Terazawa et al., "The importance of physical synthesis for the advanced LSI process technology", Technical Report of the Institute of Electronics, Information and Communication Engineers (IEICE), VLD2000-138, ICD2000-214, from p. 25, Mar. 2001.
M. Keating et al., "Reuse Methodology Manual for System-on-a-chip Designs", ISBN: 1402071418, Springer Netherlands.
N. Kuji, "Methods for Improving the Placement Ratio of E-beam Testing Pads for Multilevel-wiring LSI Circuits", Technical Report of the Institute of Electronics, Information and Communication Engineers (IEICE), vol. 103, No. 647 (ICD2003), pp. 23-28, Jan. 2004.

(Continued)

*Primary Examiner*—Vuthe Siek
*Assistant Examiner*—Aric Lin
(74) *Attorney, Agent, or Firm*—Young & Thompson

(57) ABSTRACT

A circuit design system has: a storage unit in which a netlist is stored; a fault-candidate extracting module configured to extract equivalent fault class $G_i$ from the netlist; a judgment module configured to select a target node out of a plurality of nodes $N_{i1}$ to $N_{iJi}$ included in the equivalent fault class $G_i$, wherein $J_i$ is a number of nodes included in the equivalent fault class $G_i$; and an observation-point inserting module configured to update the netlist by inserting at least one observation point into the target node. The judgment module decides the target node based on the number $J_i$.

16 Claims, 25 Drawing Sheets

OTHER PUBLICATIONS

N. Kuji et al., "EB-Testing-Pad Method and its Evaluation by Actual Devices", Proceedings of the Test Symposium 2001, Nov. 19-21, 2001, pp. 179-184.

J. Nonaka et al., "Evaluation of LVP observability in 90nm devices, and development of on-chip elements for LVP measurement", Technical Report of the Institute of Electronics, Information and Communication Engineers (IEICE), vol. 104, No. 628 (ICD2004), pp. 7-12, Feb. 2005.

K. Miyase et al., "XID: Don't Care Identification of Test Patterns for Combinational Circuits", IEEE Transactions on Computer-Aided Design of Integrated Circuits and Systems, vol. 23, No. 2, 2004.

* cited by examiner

Fig. 7

| INSERTION POSITION | FIRST EQUIVALENT FAULTS (INPUT TERMINAL SIDE) | | | SECOND EQUIVALENT FAULTS (OUTPUT TERMINAL SIDE) | | | FAILURE ANALYTICITY (M) |
|---|---|---|---|---|---|---|---|
| | $J_i$ | $\Sigma L_i$ | $D_i$ | $J_i$ | $\Sigma L_i$ | $D_i$ | |
| - | 6 | 10 | 6 | - | - | - | 6 |
| A | 1 | 1 | 0.1 | 5 | 9 | 4.5 | 4.6 |
| B | 2 | 2 | 0.4 | 4 | 8 | 3.2 | 3.6 |
| C | 3 | 3 | 0.9 | 3 | 7 | 2.1 | 3.0 |
| D | 4 | 4 | 1.6 | 2 | 6 | 1.2 | 2.8 |
| E | 5 | 5 | 2.5 | 1 | 5 | 0.5 | 3.0 |

Fig. 9

| INSERTION POSITION | 409-1 | | 409-2 | | | | 411-1 | | | 411-2 | | | FAILURE ANALYTICITY (M) |
|---|---|---|---|---|---|---|---|---|---|---|---|---|---|
| | $J_i$ | $\Sigma L_i$ | $D_i$ | $J_i$ | $\Sigma L_i$ | $D_i$ | $J_i$ | $\Sigma L_i$ | $D_i$ | $J_i$ | $\Sigma L_i$ | $D_i$ | |
| – | 6 | 10 | 4.29 | | | 0.00 | 4 | 4 | 1.14 | | | 0.00 | 5.43 |
| A | 1 | 1 | 0.07 | 5 | 9 | 3.21 | 4 | 4 | 1.14 | | | 0.00 | 4.43 |
| B | 2 | 2 | 0.29 | 4 | 8 | 2.29 | 4 | 4 | 1.14 | | | 0.00 | 3.71 |
| C | 3 | 3 | 0.64 | 3 | 7 | 1.50 | 4 | 4 | 1.14 | | | 0.00 | 3.29 |
| D | 4 | 4 | 1.14 | 2 | 6 | 0.86 | 4 | 4 | 1.14 | | | 0.00 | 3.14 |
| E | 5 | 5 | 1.79 | 1 | 5 | 0.36 | 4 | 4 | 1.14 | | | 0.00 | 3.29 |
| F | 6 | 10 | 4.29 | | | 0.00 | 3 | 3 | 0.64 | 1 | 1 | 0.07 | 5.00 |
| G | 6 | 10 | 4.29 | | | 0.00 | 2 | 2 | 0.29 | 2 | 2 | 0.29 | 4.86 |
| H | 6 | 10 | 4.29 | | | 0.00 | 1 | 1 | 0.07 | 3 | 3 | 0.64 | 5.00 |

Fig. 11

| INSERTION POSITION | FIRST EQUIVALENT FAULTS | | | SECOND EQUIVALENT FAULTS | | | FAILURE ANALYTICITY (M) |
|---|---|---|---|---|---|---|---|
| | $J_i$ | $\Sigma L_i$ | $J_i \cdot P_i$ | $J_i$ | $\Sigma L_i$ | $J_i \cdot P_i$ | |
| - | 9 | 9 | 9 | - | - | - | 9.00 |
| ANY ONE | 8 | 8 | 7.11 | 1 | 1 | 0.11 | 7.22 |

Fig. 18

| STRUCTURE | FAULT OCCURRENCE RATE |
|---|---|
| DIFFUSION REGION | R1 |
| GATE-POLY | R2 |
| CONTACT | R3 |
| FIRST METAL INTERCONNECTION | R4 |
| FIRST VIA | R5 |
| SECOND METAL INTERCONNECTION | R6 |
| SECOND VIA | R7 |
| THIRD METAL INTERCONNECTION | R8 |

Fig. 19

| STRUCTURE | 1 | 2 | ... | i | ... | I |
|---|---|---|---|---|---|---|
| DIFFUSION [um²] | S1,1 | S1,2 | ... | S1,i | ... | S1,I |
| GATE-POLY [um] | S2,1 | S2,2 | ... | S2,i | ... | S2,I |
| CONTACT | S3,1 | S3,2 | ... | S3,i | ... | S3,I |
| 1ST. METAL [um] | S4,1 | S4,2 | ... | S4,i | ... | S4,I |
| 1ST. VIA | S5,1 | S5,2 | ... | S5,i | ... | S5,I |
| 2ND. METAL [um] | S6,1 | S6,2 | ... | S6,i | ... | S6,I |
| 2ND. VIA | S7,1 | S7,2 | ... | S7,i | ... | S7,I |
| 3RD. METAL [um] | S8,1 | S8,2 | ... | S8,i | ... | S8,I |

1; CIRCUIT DESIGN SYSTEM

CIRCUIT DESIGN SYSTEM AND CIRCUIT DESIGN PROGRAM

BACKGROUND OF THE INVENTION

1. Field of the Invention

The present invention relates to a circuit design system and a circuit design system program used in designing a logic circuit. In particular, the present invention relates to a circuit design system and a circuit design system program used for facilitating a failure analysis.

2. Description of the Related Art

In an ordinary process of manufacturing semiconductor integrated circuits, defective products are included in the manufactured semiconductor integrated circuits to some degree. The defective products are eliminated in a test process and only non-defective products are shipped. Here, a rate of the non-defective products at this time is referred to as "yield". If the yield is low, then cost of manufacturing goods is increased and profit is declined. It is therefore necessary to establish a cause of the defect by a failure analysis and to enhance the yield by improving the manufacturing process.

However, the failure analysis is becoming more and more difficult as the integration degree of the semiconductor integrated circuit becomes higher. For example, it is difficult to make a potential waveform measurement (electron beam (EB) measurement) by using an electron beam apparatus, because the number of interconnection layers increases up to about eight in the present state and a measurement-target interconnection is not exposed in many cases. Alternatively, an LVP (Laser Voltage Probe) measurement may be used. The LVP measurement is a method of measuring a potential waveform by applying a laser beam onto a rear surface of a chip, and is available even if the number of interconnection layers is large (refer to, for example, National Publication of Translated Version JP-P2002-522770 and corresponding U.S. Pat. No. 6,072,179). However, in and after the generation of 90 nm, not all the transistors can become the measurement target due to lack of resolution.

Moreover, the following method is also known as a method of measuring a potential waveform in an integrated circuit. That is, the EB measurement is made after interconnections are exposed by using a focused ion beam (FIB) apparatus. However, the method requires an awful lot of operating time. For this reason, it is necessary to estimate a fault position roughly by using fault diagnosis software in advance and to specify the fault position through the measurement on the basis of the estimation result. Here, the fault diagnosis software is software that "estimates" the fault position based on a circuit diagram of a design-target integrated circuit and a test result. Moreover, the fault position extracted by the estimation is called a "fault candidate".

In this case, the number of fault candidates estimated by the above-mentioned fault diagnosis software can become very large, depending on the structure of the design-target integrated circuit. If so, it is necessary to make a measurement to confirm which fault candidate is a real fault. In the measurement, interconnections are exposed by the FIB apparatus, as already stated. Therefore, as the number of fault candidates becomes larger, the measurement time becomes longer, resulting in an increase in an operation time required for the failure analysis.

Meanwhile, a logic design program for facilitating the failure analysis is disclosed in Japanese Laid-Open Patent Application JP-P2001-14370. According to the technique disclosed in the patent document, a design of an integrated circuit is changed so that a designated observation-target interconnection can be observed by a failure analysis means (e.g., the EB measurement or the LVP measurement). A specific configuration of a circuit design system according to the conventional technique is shown in FIG. 1, and its operation is described with reference to FIG. 1.

First, circuit connection information (netlist) is input to a placing and routing means 2003 through an input means 2001. Referring to the circuit connection information, the placing and routing means 2003 performs cell placement and interconnection routing. Next, a judgment means 2005 receives an observation-target designation data through the input means 2001, and judges whether or not a circuit region designated by the observation-target designation data is observable by a failure analysis means. In a case where the circuit region is not observable, a replacement indicating means 2007 generates an interconnection-replacement order data for making the circuit region observable. The placing and routing means 2003 generates a new layout data based on the interconnection-replacement order data. That is, the placing and routing means 2003 changes the circuit layout such that the circuit region becomes observable by the predetermined failure analysis means. The new layout data is input to a circuit manufacturing apparatus 2009. As a consequence, an integrated circuit in which the failure analysis is facilitated is manufactured.

Furthermore, the patent document (Japanese Laid-Open Patent Application JP-P2001-14370) describes that an observation point is inserted into a fault undetected region or a circuit region with poor controllability and observability in the integrated circuit. However, a specific method of deciding an insertion position into which the observation point is inserted is not described in the patent document. Moreover, if the observation point is inserted into each of all circuit regions with poor observability, the area of the circuit and the overhead of operating speed become considerable and unignorable, which is a problem.

Meanwhile, a method of selecting observation points for improving failure-analyticity with fewer observation points is described in Irith Pomeranz, Srikanth Venkataraman, and Sudhakar M. Reddy, "Z-DFD: Design-for-Diagnosability based on the concept of z-detection", Proceedings of International Test Conference 2004, November 2004 (referred to as a "Non-patent Document" throughout the present specification). According to the method, observation points are first inserted into all nodes within a circuit by referring to a gate-level circuit connection information (netlist). Next, the number Np of faults (equivalent faults) whose positions can not be specified by an external measurement is calculated. At this time, the number Np is equal to zero, because all the nodes within the circuit are observable. Thereafter, an observation point is eliminated from such a node as from which the number Np does not increase even if the observation point is eliminated or such a node as from which an increase in the number Np is small even if the observation point is eliminated. The elimination is repeated. As a result, some observation points are eliminated while the increase in the number Np is suppressed as possible. It is thus expected that the failure-analyticity is improved with a small number of observation points.

As a technique related to the circuit design, a "physical synthesis method" is known. The physical synthesis method is described, for example, in Toshihiro Terazawa, Tatsuya Higashi, Yoshinori Watanabe, Takayoshi Shimazawa, Masafumi Takahashi, and Tohru Furuyama, "The Importance of Physical Synthesis for the advanced LSI process technology", Technical Report of the Institute of Electronics, Information and Communication Engineers (IEICE), VLD2000-

138, ICD2000-214, from p. 25, March 2001. Also, the physical synthesis method is described in "Reuse Methodology Manual for System-on-a-Chip Designs", ISBN: 1402071418, by Michael Keating and Pierre Bricaud, SPRINGER NETHERLANDS. FIG. 2 is a flowchart showing the physical synthesis method. First, functions of a desired circuit are designed (Step S2101). Next, logic synthesis and cell placement are carried out simultaneously in parallel (Step S2103). It should be noted here that logic synthesis of the entire circuit is not performed all at once but that logic synthesis of one to a few cells is performed and then placement of the cells is immediately performed. Thereafter, clock tree synthesis and routing are carried out (Step S2105). Then, a delay time of a signal is calculated from a distance between cells, and the logic and the cell placement are optimized (Step S2107). By repeating the above-mentioned procedures, the entire circuit is designed.

SUMMARY OF THE INVENTION

The inventor of the present invention has recognized the following point. According to the conventional technique described in the above-mentioned non-patent document, at the time when the insertion position into which the observation point is inserted is decided, only the netlist of the circuit is used and fault occurrence rate at every nodes is not taken into consideration. Therefore, there is a possibility that the observation point is unnecessarily inserted into a node at which the fault occurrence rate is low.

In a first aspect of the present invention, a circuit design system is provided. The circuit design system has a storage unit, a fault-candidate extracting module, a judgment module, and an observation-point inserting module. A netlist indicating a circuit connection information is stored in the storage unit. The fault-candidate extracting module extracts equivalent fault class $G_1$ to $G_I$ (I is an integer equal to or greater than 1) from the netlist, and generates a fault-candidate data indicating the extracted equivalent fault class $G_i$ (i is an integer not less than 1 and not greater than I). The equivalent fault class is a portion of a design target circuit, in which a fault position can not be specified by an external measurement since its behavior appears to be the same with respect to any external input. The equivalent fault class $G_i$ includes a plurality of equivalent fault nodes $N_{i1}$ to $N_{iJi}$ ($J_i$ is a number of nodes included in the equivalent fault class $G_i$). The judgment module selects a target node out of the plurality of nodes $N_{i1}$ to $N_{iJi}$ included in the equivalent fault class $G_i$ indicated by the fault-candidate data, wherein at least one observation point used for failure analysis is inserted into the target node. The observation-point inserting module updates the netlist by inserting the at least one observation point into the target node.

According to the present invention, the judgment module decides the target node based on the number $J_i$. For example, it is highly possible that a probability of fault occurrence in an equivalent fault class $G_i$ having the maximum node number $J_i$ takes a maximum value among all the equivalent fault classes $G_1$ to $G_I$. Therefore, the judgment module can select the target node from the equivalent fault class $G_i$ having the maximum node number $J_i$. By inserting the observation point preferentially into the equivalent fault class including a lot of equivalent fault nodes, it is possible to "efficiently" reduce the number of fault candidates as a whole. In other words, it is possible to improve the failure-analyticity with fewer observation points.

More specifically, the judgment module calculates a parameter $D_i$ related to the equivalent fault class $G_i$. The parameter $D_i$ with respect to the equivalent fault class $G_i$ is given by the following equation: $D_i=J_i \times P_i$. The $P_i$ is a probability that a fault is included in the equivalent fault class $G_i$. As shown in the above equation, the parameter Di depends on the node number $J_i$ and the probability $P_i$. A sum of the parameter $D_i$ with respect to all equivalent fault class is represented by M. The judgment module decides the target node such that the sum M is reduced due to the insertion of the observation point. Preferably, the judgment module selects the target node from one equivalent fault class $G_i$ that has the maximum parameter $D_i$ among all the equivalent fault class $G_1$ to $G_I$. The probability $P_i$ can be determined in various ways depending on a model. For example, the probability $P_i$ depends on interconnection length in the equivalent fault class $G_i$, and it is highly possible that the probability $P_i$ is high with respect to one equivalent fault class $G_i$ that has the maximum interconnection length. Such the equivalent fault class $G_i$ corresponds to an equivalent fault class having a large parameter $D_i$. Therefore, the judgment module can select the target node preferentially from the one equivalent fault class $G_i$ that has the maximum interconnection length among all the equivalent fault class $G_1$ to $G_I$.

According to the present invention, as described above, the observation point is preferentially inserted into an equivalent fault class $G_i$ that has relatively large parameter $D_i$. As a result, the failure-analyticity can be improved "efficiently". That is, the failure-analyticity is improved even with the small number of observation points. In other words, it is possible to optimize the observation-point insertion positions and to facilitate the failure analysis with the small number of observation points.

Moreover, according to the circuit design system of the present invention, the netlist into which the observation point is inserted is not limited to such a netlist as for which the logic synthesis is completed wholly. The observation point can be inserted into such a netlist as for which the logic synthesis is completed partially. Therefore, the circuit design system according to the present invention can be applied to a circuit design based on the above-mentioned physical synthesis method. On the other hand, according to the conventional technique described in the above-mentioned non-patent document as a comparison, some observation points are appropriately eliminated after the observation points are once inserted into all the nodes within the circuit. Therefore, the netlist into which the observation points are inserted is limited to the netlist for which the logic synthesis is completed wholly. Thus, it is not possible to apply the conventional technique to the physical synthesis method in which the logic synthesis and the cell placement are performed simultaneously.

In a second aspect of the present invention, a circuit design program executed by a computer is provided. The circuit design program is executed by a computer including a processing unit and a storage unit, and the foregoing circuit design system is achieved.

According to the circuit design system and the circuit design program of the present invention, the insertion position into which the observation point is inserted is optimized. As a result, the failure-analyticity is improved even with the small number of observation points inserted. In other words, it is possible to efficiently facilitate the failure analysis with fewer observation points.

Furthermore, the circuit design system and the circuit design program according to the present invention can be applied to the physical synthesis design method. That is, even in a case where the physical synthesis method is employed, it is possible to facilitate the failure analysis by inserting the observation point.

BRIEF DESCRIPTION OF THE DRAWINGS

The above and other objects, advantages and features of the present invention will be more apparent from the following description taken in conjunction with the accompanying drawings, in which:

FIG. 7 is a table showing a change of failure-analyticity when an observation point is inserted into the circuit shown in FIG. 6;

FIG. 9 is a table showing a change of failure-analyticity when an observation point is inserted into the circuit shown in FIG. 8;

FIG. 11 is a table showing a change of failure-analyticity when an observation point is inserted into the circuit shown in FIG. 10;

FIG. 18 is a table indicating fault occurrence rate calculated for every structures in a design-target integrated circuit;

FIG. 19 is a table indicating amounts of respective structures shown in FIG. 18 included in every equivalent fault classes;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. First Embodiment

Figure 1:
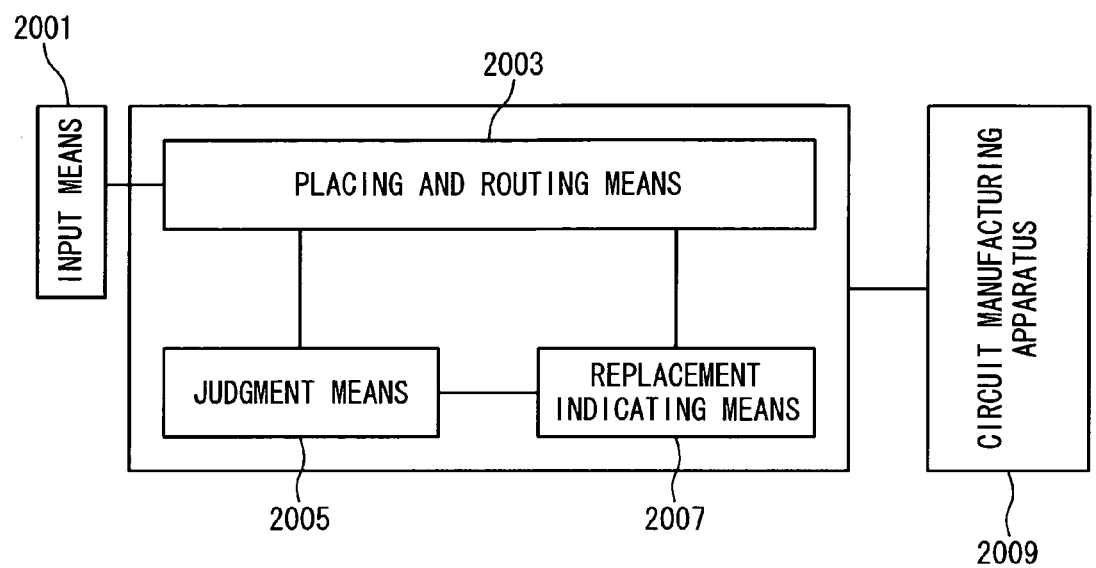
FIG. 1 is a block diagram showing a configuration of a circuit design system according to a conventional technique.
Figure 2:
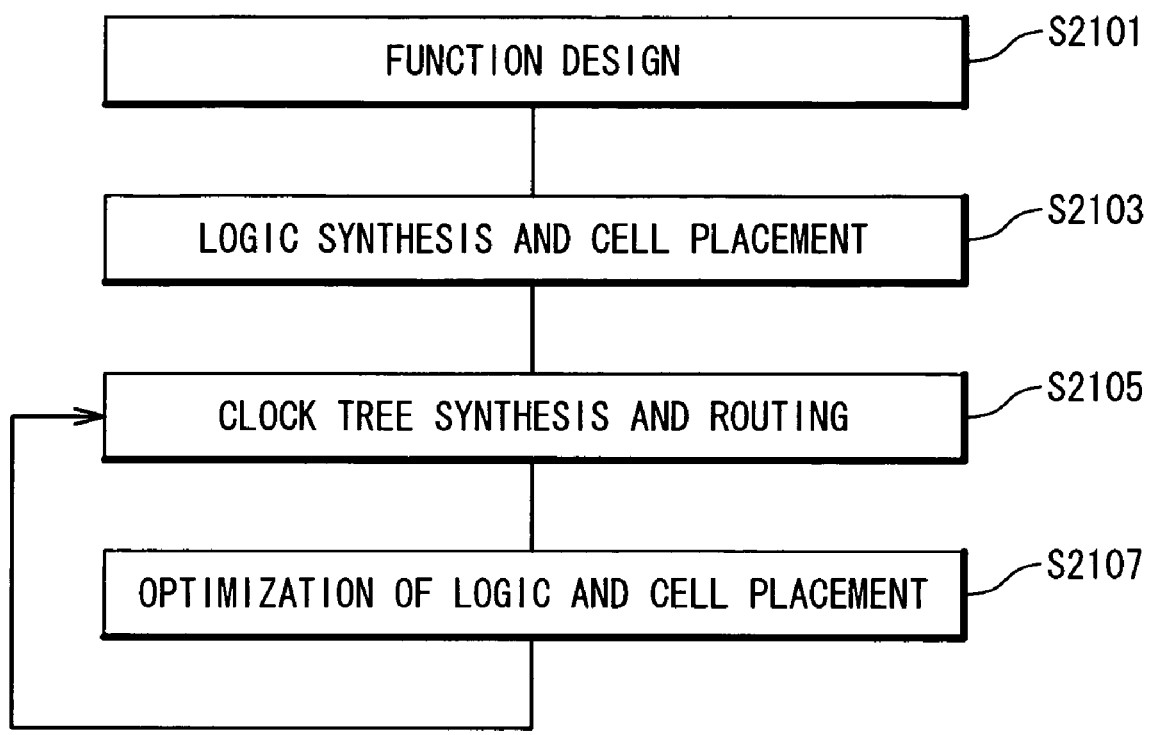
FIG. 2 is a flowchart showing a general physical synthesis design method.
Figure 3:
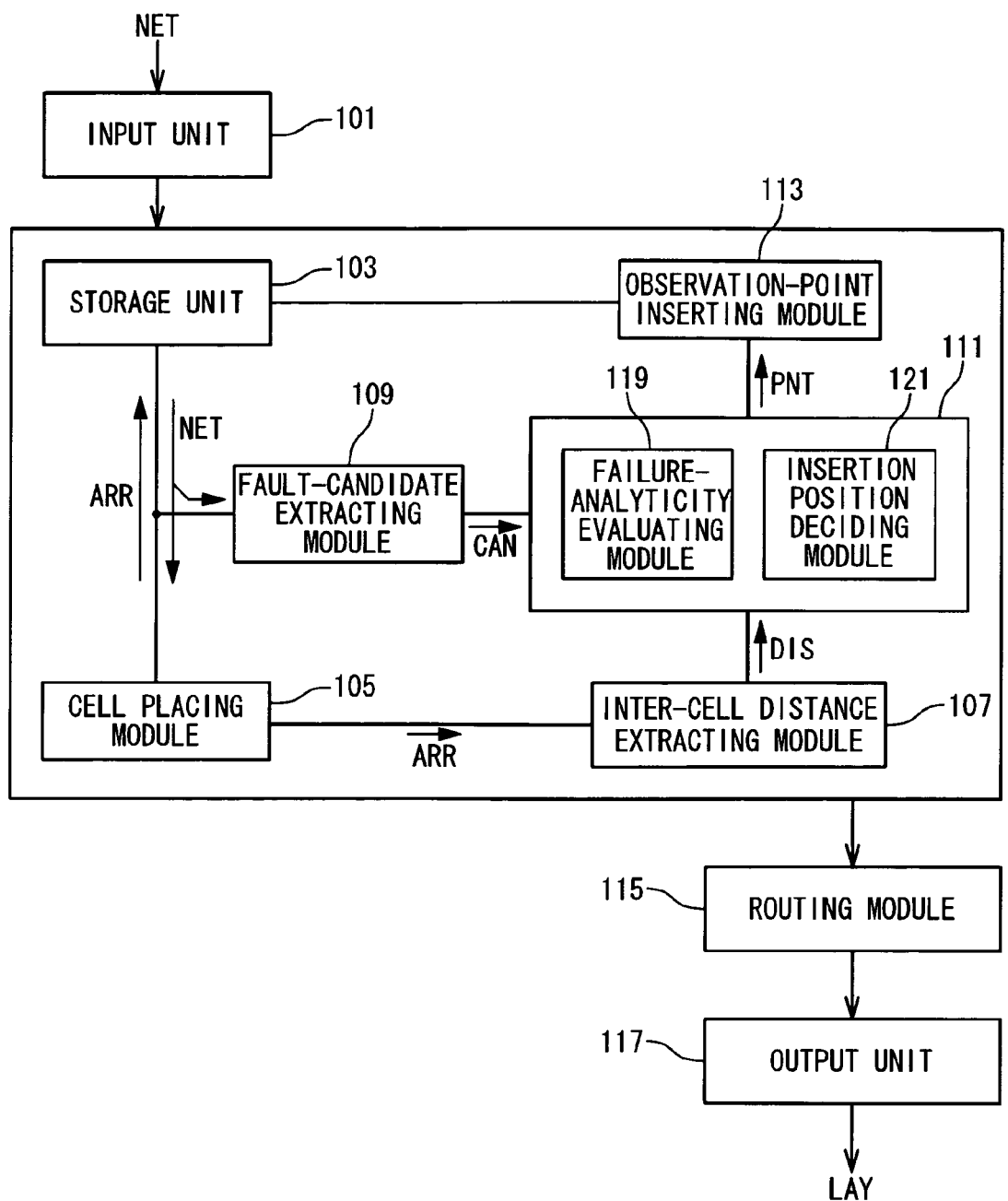
FIG. 3 is a block diagram showing a configuration of a circuit design system according to a first embodiment of the present invention.

FIG. 3 is a block diagram showing a configuration of a circuit design system (a failure analysis facilitating design system) according to a first embodiment of the present invention. The circuit design system shown in FIG. 3 generates a layout data LAY indicating a layout of a design-target circuit from a netlist NET indicating connection information of the design-target circuit. The circuit design system can be realized by, for example, a processing unit, a storage unit, and a computer program (circuit design program) executed by the processing unit.

Firstly, a general description will be given on the circuit design system according to the present embodiment. As shown in FIG. 3, the circuit design system has an input unit 101, a storage unit 103, a cell placing module 105, an inter-cell distance extracting module 107, a fault-candidate extracting module 109, a judgment module 111, an observation-point inserting module 113, a routing module 115, and an output unit 117.

The netlist NET indicating the circuit connection information is input to the circuit design system by the input unit 101 and stored in the storage unit 103. By referring to the netlist NET stored in the storage unit 103, the cell placing module 105 places (arranges) cells included in the design-target circuit. Then, the cell placing module 105 generates a placement data ARR indicating the placement (arrangement) of the cells. The placement data ARR is stored in the storage unit 103 and also output to the inter-cell distance extracting module 107. Based on the cell placement indicated by the received placement data ARR, the inter-cell distance extracting module 107 extracts and calculates distances between cells (hereinafter, referred to as inter-cell distances). The inter-cell distance extracting module 107 generates an inter-cell distance data DIS indicating the obtained inter-cell distances. The inter-cell distance data DIS is output to the judgment module 111.

The fault-candidate extracting module 109 extracts "fault candidate groups" in the design-target circuit with reference to the netlist NET, and generates a fault-candidate data CAN indicating the extracted fault candidate groups. Here, a fault candidate means a fault the position of which can not be specified by an external measurement. The position of the fault candidate can not be specified even by fault diagnosis software. A "fault candidate group" is a group of fault candidates, in which the fault position can not be specified. The fault candidate group is generally referred to as an "equivalent fault class" (to be described later). The fault-candidate extracting module 109 extracts equivalent fault classes from the netlist NET, and generates the fault-candidate data CAN indicating the extracted fault candidate classes. The fault-candidate data CAN is output to the judgment module 111.

Each of the equivalent fault classes includes a plurality of equivalent fault nodes (hereinafter, simply referred to as a node). An observation point used for the failure analysis will be inserted into at least one node of the plurality of nodes. The one node is referred to as a "target node" hereinafter, and it is the judgment module 111 that decides the target node. The judgment module 111 receives the fault-candidate data CAN and the inter-cell distance data DIS. The judgment module 111 judges into which of the nodes included in the equivalent fault class indicated by the fault-candidate data CAN the at least one observation point is to be inserted. According to the present embodiment, the judgment module 111 selects and decides at least one target node with reference to the inter-cell distance data DIS generated by the inter-cell distance extracting module 107.

More specifically, the judgment module 111 includes a failure-analyticity evaluating module 119 and an insertion position deciding module 121. The failure-analyticity evaluating module 119 calculates and evaluates "failure-analyticity" of the nodes included in the equivalent fault class with reference to the inter-cell distances indicated by the inter-cell distance data DIS. The insertion position deciding module 121 selects and decides the target node out of the nodes based on the obtained failure-analyticity.

In this manner, the judgment module 111 decides at least one target node and generates an observation-point insertion position data PNT indicating the decided target node. The observation-point insertion position data PNT is output to the observation-point inserting module 113. By referring to the netlist NET stored in the storage unit 103, the observation-point inserting module 113 inserts the at least one observation point into the target node of the design-target circuit. The observation-point inserting module 113 thereby updates the netlist NET stored in the storage unit 103.

The above-described processing is repeated as necessary. When the insertion of necessary observation points is completed, the routing module 115 reads out the netlist NET and the placement data ARR from the storage unit 103. Then, the routing module 115 decides interconnection routing, namely, interconnections between cells based on the netlist NET and the placement data ARR. The routing module 115 thereby generates the layout data LAY indicating the layout of the design-target circuit. The generated layout data LAY is output by the output unit 117.

Figure 4:
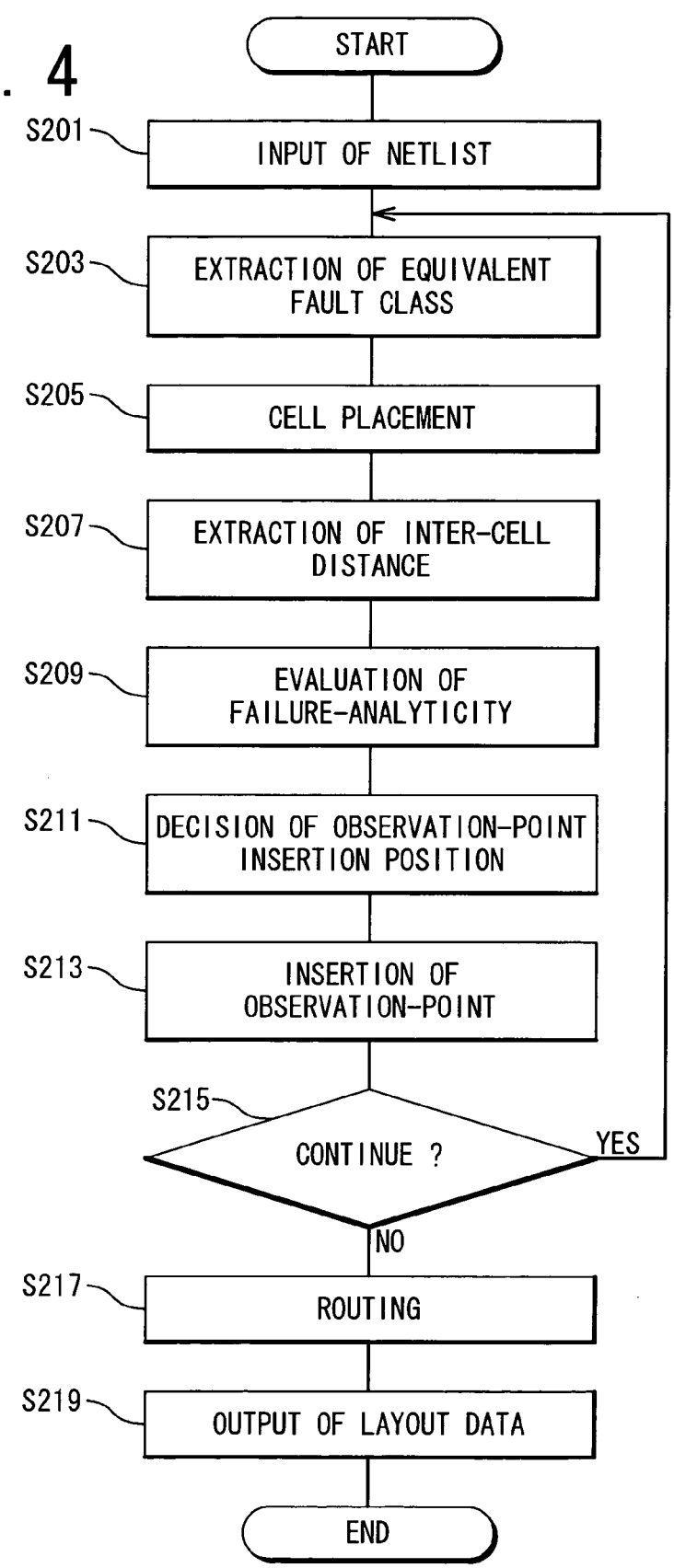
FIG. 4 is a flowchart showing a circuit design method according to the first embodiment.

FIG. 4 is a flowchart showing a circuit design method according to the present embodiment. The processing according to the present embodiment will be described in more detail referring to the flowchart shown in FIG. 4 and the configuration shown in FIG. 3.

(1) Step S201: Input of Netlist

The netlist NET is input by the input unit 101 and stored in the storage unit 103. The netlist NET describes constituent components of the design-target circuit and information of inter-component connection. The constituent component of the circuit is generally referred to as a "cell".

(2) Step S203: Extraction of Equivalent Fault Class

A logic circuit includes a part in which fault position can not be specified by an external measurement. The presence of such a fault part will be demonstrated with reference to a circuit example shown in FIG. 5. The circuit example shown in FIG. 5 includes a NOR element 301 and a NAND element 303. Terminals connected to inputs and outputs of the NOR element 301 and the NAND element 303 are denoted by terminals 305 to 313. Each of the terminals 305 to 313 has a logical value "0" or "1". Here, let us consider a "stuck-at fault" that the logical value is fixed to "0" or "1". For example, if the logical value of any of the terminal 305 and the terminal 307 is stuck at "1" (stuck-at-1 fault), the logical value of the output terminal 313 is stuck at "1". Moreover, if the logical value of any of the terminal 309 and 311 is stuck at "0" (stuck-at-0 fault), the logical value of the output terminal 313 is also stuck at "1". That is to say, the logical value of the output terminal 313 is stuck at "1" in each case. The failure diagnosis software can "detect" a fault from the fact that the output of the NAND element 303 is fixed to "1". However, the failure diagnosis software can not "specify" which of the above-mentioned two patterns (stuck-at-0 fault and stuck-at-1 fault) causes the fault. In other words, it is not possible to specify the fault position by the external measurement. A group of the faults (stuck-at-0 fault and stuck-at-1 fault) in which the fault position can not be specified is the "equivalent fault class". The equivalent fault class includes a plurality of nodes 305 to 313.

The fault-candidate extracting module 109 extracts equivalent fault classes included in the design-target circuit based on the circuit information indicated by the netlist NET input in the Step S201. The fault-candidate extracting module 109 outputs the fault-candidate data CAN indicating the extracted equivalent fault classes to the judgment module 111. Each equivalent fault class includes a plurality of fault candidates. To confirm which of the fault candidates included in the equivalent fault class is a true fault, it is necessary to check by measurement. To this end, it is necessary to make the fault candidates observable. In the failure analysis, interconnection exposure process is often performed by using an FIB apparatus for the purpose of the measurement. However, as the number of process-target positions becomes larger, workload and cost are increased. Therefore, it is preferable to provide observation points in the design-target circuit in advance. By doing so, the total number of equivalent faults is reduced, and the failure analysis can be facilitated, which will be described later.

(3) Step S205: Cell Placement

Meanwhile, the cell placing module 105 places the cells included in the design-target circuit by using the netlist NET input in the Step S201. In this processing, the cells included in the netlist NET are placed (arranged) in a cell arrangement area on a design layer. The data indicating the result of the cell placement is referred to as the "placement data ARR". The cell placing module 105 generates the placement data ARR and stores the placement data ARR in the storage unit 103. The cell placing module 105 also outputs the placement data ARR to the inter-cell distance extracting module 107.

(4) Step S207: Extraction of Inter-Cell Distance

Next, the inter-cell distance extracting module 107 calculates and extracts the inter-cell distances based on the result of the cell placement indicated by the placement data ARR. More specifically, a distance between cells connected to each other in the netlist NET is calculated. If three or more cells are connected to one node, the inter-cell distance extracting module 107 decides the shortest path that passes through all of the three or more cells and thereby calculates the distance as the inter-cell distance. In calculating the inter-cell distance, a minimum Steiner tree search method such as the Melzak algorithm can be employed. The inter-cell distance extracting module 107 outputs the inter-cell distance data DIS indicating the calculated inter-cell distances to the judgment module 111.

(5) Step S209: Calculation and Evaluation of Failure-Analyticity

The judgment module 111 decides the target node into which the observation point is inserted, based on the fault-candidate data CAN generated in the Step S203 and the inter-cell distance data DIS generated in the Step S207. First, the failure-analyticity evaluating module 119 of the judgment module 111 calculates a parameter called "failure-analyticity M" with respect to each of the equivalent fault classes indicated by the fault-candidate data CAN. At the time of the calculation, the failure-analyticity evaluating module 119 refers to the inter-cell distances indicated by the inter-cell distance data DIS.

A specific calculating method is as follows. The number of a plurality of equivalent fault classes included in the circuit indicated by the netlist NET is represented by "I" (I is an integer equal to or greater than 1). The equivalent fault classes are referred to as $G_1, G_2, \ldots,$ and $G_I$, respectively. Each of the equivalent fault classes includes a plurality of equivalent fault nodes (hereinafter, simply "nodes"). The number of nodes included in the equivalent fault class $G_i$ (where i is an integer not less than 1 and not greater than I) is represented by $J_i$. The nodes included in the equivalent fault class $G_i$ are referred to as $N_{i1}, N_{i2} \ldots$ and $N_{i,Ji}$, respectively.

Moreover, interconnection lengths of the nodes $N_{i1}$, $N_{i2} \ldots$ and $N_{i,Ji}$ are referred to as $L_{i1}, L_{i2} \ldots$ and $L_{i,Ji}$, respectively. At the present step, the interconnection routing is not yet performed, so that the exact interconnection lengths are not known. In the present embodiment, therefore, the inter-cell distance calculated in the Step S207 is approximately used as the interconnection length of each node. Namely, the failure-analyticity evaluating module 119 of the judgment module 111 sets the inter-cell distance indicated by the inter-cell distance data DIS as the interconnection length $L_{ij}$ (where i is an integer not less than 1 and not greater than I; j is an integer not less than 1 and not greater than $J_i$). If a diagonal interconnection is prohibited as a restriction peculiar to a semiconductor integrated circuit, the inter-cell distance should be calculated in the Step S207 on the basis that no diagonal interconnections are used.

Here, let us consider a case where either "stuck-at-0 fault" or "stuck-at-1 fault" occurs at an arbitrary one of the interconnections included in the design-target circuit. In this case, a probability $P_i$ that the fault is included in the equivalent fault class $G_i$ is given by the following equation (1).

$$P_i = \frac{1}{2} \cdot \frac{\sum_{j=1}^{J_i} L_{ij}}{L_{all}} \qquad (1)$$

In the equation (1), $L_{all}$ is the sum of lengths of all interconnections included in all the equivalent fault classes $G_i$, and is given by the following equation (2).

$$L_{all} = \sum_{i=1}^{I} \sum_{j=1}^{J_i} L_{ij} \qquad (2)$$

The numerator of the equation (1) is the sum of the interconnection lengths $L_{ij}$ with regard to one equivalent fault class $G_i$. The failure-analyticity evaluating module 119 calculates the probability $P_i$ related to the one equivalent fault class $G_i$ as a value that depends on the sum. Instead of the above-mentioned $L_{all}$, a sum of lengths of all interconnections included in whole of the design-target circuit may be used in the above equation (1).

Next, the failure-analyticity evaluating module 119 calculates a parameter M with respect to the design-target circuit in accordance with the following equation (3). Parameter $D_i$ in the equation (3) is expressed by the following equation (4).

$$M = \sum_{i=1}^{I} D_i \qquad (3)$$

$$D_i = J_i \cdot P_i \qquad (4)$$

As shown in the equation (4), the parameter $D_i$ associated with an equivalent fault class $G_i$ is calculated from the number $J_i$ of nodes included in the equivalent fault class $G_i$ and the probability $P_i$. It should be particularly noted that the parameter $D_i$ depends on the number $J_i$ of nodes. As shown in the equation (3), the parameter M is defined as a sum of the parameters $D_i$ with respect to all the equivalent fault classes $G_1$ to $G_I$. In the case where the stuck-at fault occurs in an equivalent fault class $G_i$, the sum of the parameters $D_i$ indicates the average number of equivalent fault nodes included in the entire design-target circuit. The parameter M given by the equation (3) being large means that the number of equivalent fault nodes (fault candidates) is large. As the number of fault candidates becomes large, the failure analysis by the failure diagnosis software becomes more difficult.

Conversely, as the parameter M becomes smaller, the failure analysis becomes easier. In that sense, the parameter M can be referred to as "failure-analyticity". The parameter $D_i$ indicates the failure-analyticity with respect to each equivalent fault class, and the parameter M indicates the sum of the failure-analyticity with respect to all the equivalent fault classes. In the present invention, reducing the parameter M is equivalent to improving the failure-analyticity. In order to reduce the parameter M, observation points that are externally observable should be inserted into appropriate positions. If the parameter M can be made smaller as possible with fewer number of observation points as possible, it is possible to realize the object of the present invention, i.e., facilitating the failure analysis with the smaller number of observation points inserted. The processing for inserting the observation point will be described below.

(6) Step S211: Decision of Observation-Point Insertion Position

The insertion position deciding module 121 of the judgment module 111 selects and decides the position (target node) into which at least one observation point is inserted. Here, the insertion position deciding module 121 decides the target node such that the parameter M is reduced due to the insertion of the observation point. By selecting such a node as which the reduction amount or the reduction rate of the parameter M is large or high due to the insertion of the observation point, it is possible to efficiently reduce the number of equivalent fault nodes. Preferably, the insertion position deciding module 121 decides the target node such that the reduction rate of the parameter M due to the insertion of the observation point takes a maximum value.

An example of a method of deciding the target node so as to efficiently reduce the parameter M will be described below with reference to FIGS. 6 and 7. A circuit example shown in FIG. 6 includes an input terminal 401, five inverters 403, and an output terminal 405. A signal input from the input terminal 401 sequentially passes through the inverters 403 and arrives at the output terminal 405. Reference numerals 407 (A) to 407 (E) denote nodes between the elements. The nodes 407 (A) to 407 (E) are positions into which the observation point can be inserted. To simplify description, it is assumed that the observation point is inserted to an output of the inverter 403. A case where the observation point is inserted to middle of the interconnection is not described herein. Moreover, in FIG. 6, a number adjacent to the interconnection between the elements represents the interconnection length of each node.

Figure 6:
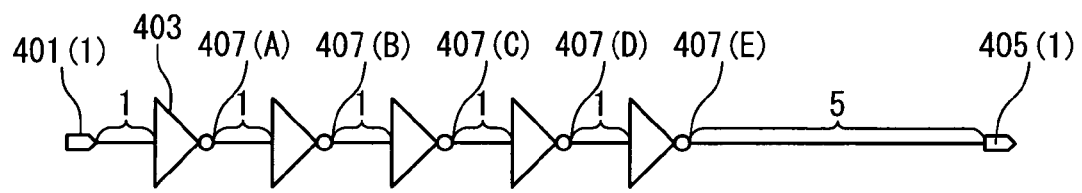
FIG. 6 is a circuit diagram for explaining a method of deciding a position into which an observation point is inserted.

In a state where the observation point is not inserted, the circuit shown in FIG. 6 constitutes one equivalent fault class as a whole. If the observation point is inserted, it becomes possible by measurement to confirm on which side a true fault is present, the input terminal 401 side or the output terminal 405 side of the inserted observation point. Namely, the one equivalent fault class is divided into two equivalent fault classes at the position into which the observation point is inserted. When one equivalent fault class is divided by the observation point into a first equivalent fault class and a second equivalent fault class, two parameters $D_i$ are calculated for respective of the first and second equivalent fault classes (see the equation (4)). Then, the parameter M is calculated by summing up the two parameters $D_i$. It should be noted that the following equation (5) is used in place of the foregoing equation (1) to calculate the probability $P_i$ because the circuit shown in FIG. 6 is constituted only by the inverters.

$$P_i = \frac{\sum_{j=1}^{J_i} L_{ij}}{L_{all}} \quad (5)$$

When the equation (5) is compared with the equation (1), it is found that a constant term "½" is not present in the equation (5). This is because the circuit constituted only by the inverters can be an equivalent fault class whether the input logic is "0" or "1". The total length $L_{all}$ used in calculating the probability $P_i$ is "10" as shown in FIG. 6.

FIG. 7 is a table for explaining a change in the parameter M (failure-analyticity) due to the insertion of the observation point. More specifically, the parameter M is compared between a case where no observation point is inserted and a case where one observation point is inserted into any one of the nodes 407 (A) to 407 (E). As is obvious from FIG. 7, the parameter M takes a minimum value when the observation point is inserted into the node 407 (D). It should be noted that, when the observation point is inserted into the node 407 (D), the parameter $D_i$ (=1.6) with respect to the first equivalent fault class is closest to the parameter $D_i$ (=1.2) with respect to the second equivalent fault class. When the observation point is inserted into an equivalent fault class $G_i$, it is preferable to decide the target node such that the parameters $D_i$ calculated with respect to the first and second equivalent fault classes obtained by dividing the equivalent fault class become closest to each other. By doing so, the failure-analyticity can be improved most efficiently.

Figure 8:
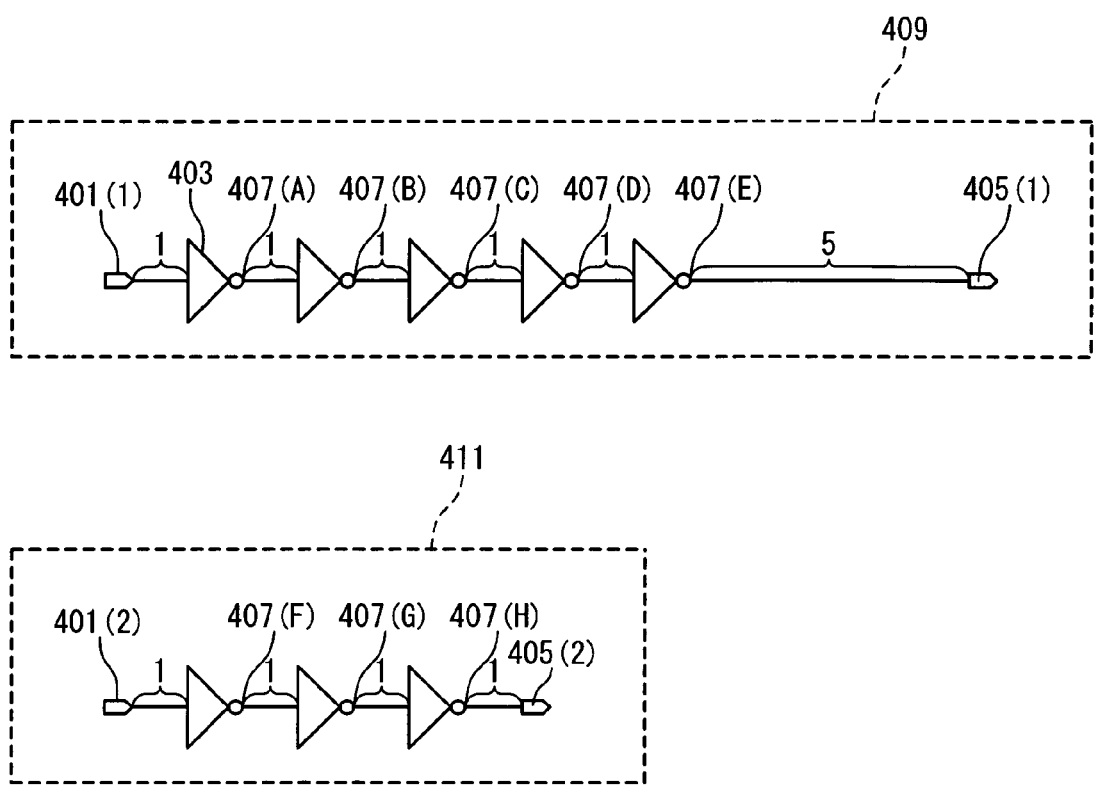
FIG. 8 is a circuit diagram for explaining another method of deciding a position into which an observation point is inserted.

Another example will be described below with reference to FIGS. 8 and 9. A circuit example shown in FIG. 8 has an equivalent fault class 409 and another equivalent fault class 411. The equivalent fault class 409 has the same configuration as the circuit shown in FIG. 6. The equivalent fault class 411 includes an input terminal 401 (2), three inverters 403, and an output terminal 405 (2). Reference numerals 407 (F) to 407 (H) denote nodes between the elements. The nodes 407 (F) to 407 (H) are positions into which the observation point can be inserted. Similarly to FIG. 6, a number adjacent to the interconnection between the elements represents the interconnection length of each node.

FIG. 9 is a table showing a comparison result similar to that shown in FIG. 7. The equivalent fault class 409 is divided into two equivalent fault classes 409-1 and 409-2 due to the insertion of the observation point. The equivalent fault class 411 is divided into two equivalent fault classes 411-1 and 411-2 due to the insertion of the observation point. As is obvious from FIG. 9, the parameter M takes a minimum value when the observation point is inserted into the node 407 (D).

Furthermore, it can be seen from FIG. 9 that the failure-analyticity M is not improved so greatly when the observation point is inserted into any of the nodes 407 (F) to 407 (H) included in the equivalent fault class 411. The reason is that the parameter $D_i$ (=1.14) with respect to the equivalent fault class 411 is smaller than the parameter $D_i$ (=4.29) with respect to the equivalent fault class 409. The failure-analyticity M is calculated as the sum of the parameters $D_i$. Therefore, even if the observation point is inserted into the equivalent fault class 411 whose parameter $D_i$ is originally small, the parameter M is not reduced so greatly. Conversely, it is possible to greatly reduce the parameter M by inserting the observation point into the equivalent fault class 409 that has relatively large parameter $D_i$. In other words, it is preferable to insert the observation point into the equivalent fault class that has a large parameter $D_i$, in order to efficiently improve the failure-analyticity.

Preferably, the insertion position deciding module 121 selects the target node from one equivalent fault class $G_i$ that has a maximum parameter $D_i$ among all the equivalent fault classes. As expressed by the equation (4), the parameter $D_i$ depends on the number $J_i$ of nodes and the probability $P_i$. Therefore, the insertion position deciding module 121 can select the target node from one equivalent fault class $G_i$ that has a maximum number $J_i$ among all the equivalent fault classes. By inserting the observation point preferentially into an equivalent fault class including a lot of equivalent fault nodes, it is possible to efficiently improve the failure-analyticity. Alternatively, the insertion position deciding module 121 can select the target node from one equivalent fault class $G_i$ that has the highest probability $P_i$, i.e., the maximum interconnection length among all the equivalent fault classes. In a circuit region in which the inter-cell distance is large, the interconnection length connecting between cells is also large, and thus the probability of fault occurrence is higher. By inserting the observation point preferentially into such a circuit region, it is possible to efficiently improve the failure-analyticity.

Figure 10:
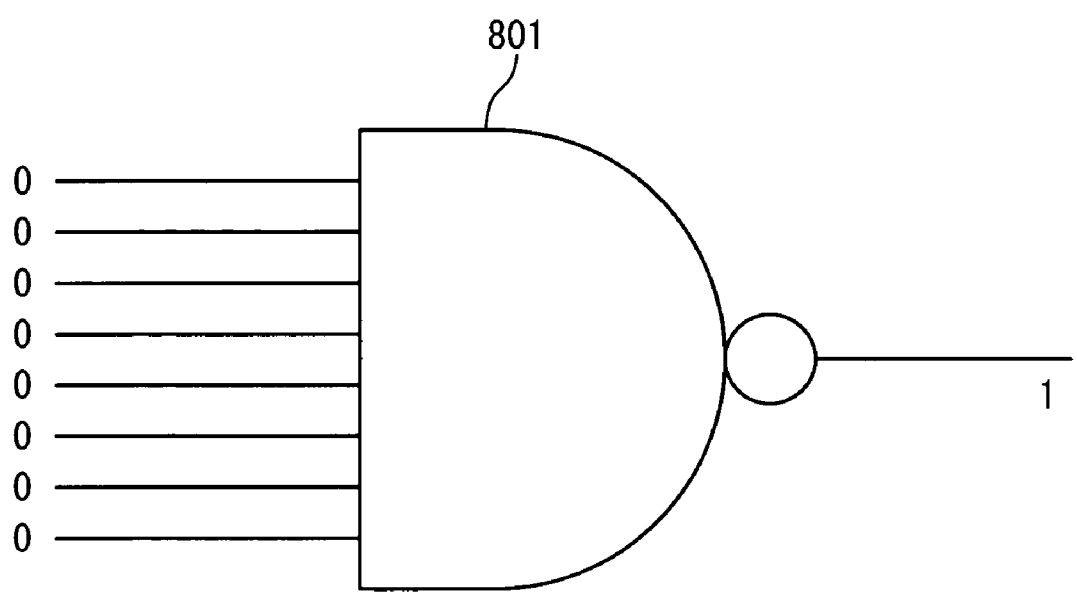
FIG. 10 is a circuit diagram for explaining still another method of deciding a position into which an observation point is inserted.

Still another example will be described below with reference to FIGS. 10 and 11. The circuit example shown in FIG. 10 includes an eight-input NAND element 801. A "stuck-at-0 fault" of an input terminal of the NAND element 801 is equivalent to a "stuck-at-1 fault" of an output terminal of the NAND element 801. Since the equivalent fault class shown in FIG. 10 includes nine nodes, the parameter $D_i$ with respect to the equivalent fault class is large.

FIG. 11 is a table showing a comparison result similar to that shown in FIG. 7. As is obvious from FIG. 11, the parameter M is not reduced so greatly whichever node the observation point is inserted into. This results from the structure of the eight-input NAND element. Namely, whichever node the observation point is inserted into, the ratio of the node numbers included in respective of the two equivalent fault classes is always 1:8. It is better not to insert the observation point into such an equivalent fault class. As described above, even if the parameter $D_i$ is large, the improvement of the failure-analyticity by the insertion of the observation point may not be so conspicuous occasionally.

In the manner described above, the judgment module 111 decides the target node into which the observation-point is inserted. The observation-point insertion position data PNT indicating the decided target node is output to the observation-point inserting module 113.

(7) Step S213: Insertion of Observation-Point

Next, the observation-point inserting module 113 updates the netlist NET and the placement data ARR stored in the storage unit 103 in response to the observation-point insertion position data PNT. More specifically, the observation-point inserting module 113 refers to the netlist NET and actually inserts the observation point into the position (target node) decided in the Step S211. As a result, the target node is made observable from the outside.

Similarly, the observation-point inserting module 113 inserts the observation point into the decided position (target node) in the circuit indicated by the placement data ARR. Here, if the distance between a circuit region to be observed and the observation point is large, an interconnection capacity between them becomes a conspicuous driving load for the cells. Since the driving load affects the delay time of the circuit, the observation point should be placed as near the circuit region to be observed as possible. If an appropriate region is not available near the circuit region to be observed, peripheral circuit elements are moved to secure the region for the placement of the observation point.

In addition, if the observation point is inserted into a critical path (maximum delay path), increase in the delay may cause decrease in an operation speed of the circuit as a whole. If this causes a serious problem, the observation-point inserting module 113 inserts the observation point into a position other than the critical path.

As the observation point, an EB-measurement test pad described in the following reference documents may be used: Norio Kuji, "Method for Improving the Placement Ratio of E-beam Testing Pads for Multilevel-wiring LSI Circuits", Technical Report of the Institute of Electronics, Information and Communication Engineers (IEICE), VOL. 103, NO. 647 (ICD2003), pp. 23-28, January 2004; or Kuji, N. and Ishihara, T., "EB-testing-pad Method and its Evaluation by Actual Devices", Proceedings of the Test Symposium 2001, 19-21 November 2001, pp. 179-184. Alternatively, an LVP measurement element described in the following reference document may be used as the observation point: Junpei Nonaka and Shinichi Wada, "Evaluation of LVP observability in 90 nm devices, and development of on-chip elements for LVP measurement", Technical Report of the Institute of Electronics, Information and Communication Engineers (IEICE), VOL. 104, NO. 628 (ICD2004), pp. 7-12, February 2005.

Furthermore, an observation method using visible light, X-rays, ultrasonic wave or the like can be adopted. Moreover, a transistor of a gate element included in the circuit is replaced by a larger transistor, and the larger transistor can be employed as an LVP-measurement target element. Namely, the transistor large enough to enable the LVP measurement can be connected to the target node. Even in an advanced integrated circuit of 90-nanometer generation or 65-nanometer generation, the LVP measurement can be easily performed with respect to the gate element with large transistor.

Moreover, the interconnection corresponding to the target node can be extended to the surface of the semiconductor chip. Alternatively, the target node can be electrically and directly connected to the external input/output terminal of the integrated circuit or connected thereto via a switching circuit such as a multiplexer. In this case, the potential waveform of the target node can be electrically measured from the outside of the integrated circuit.

Figure 12:
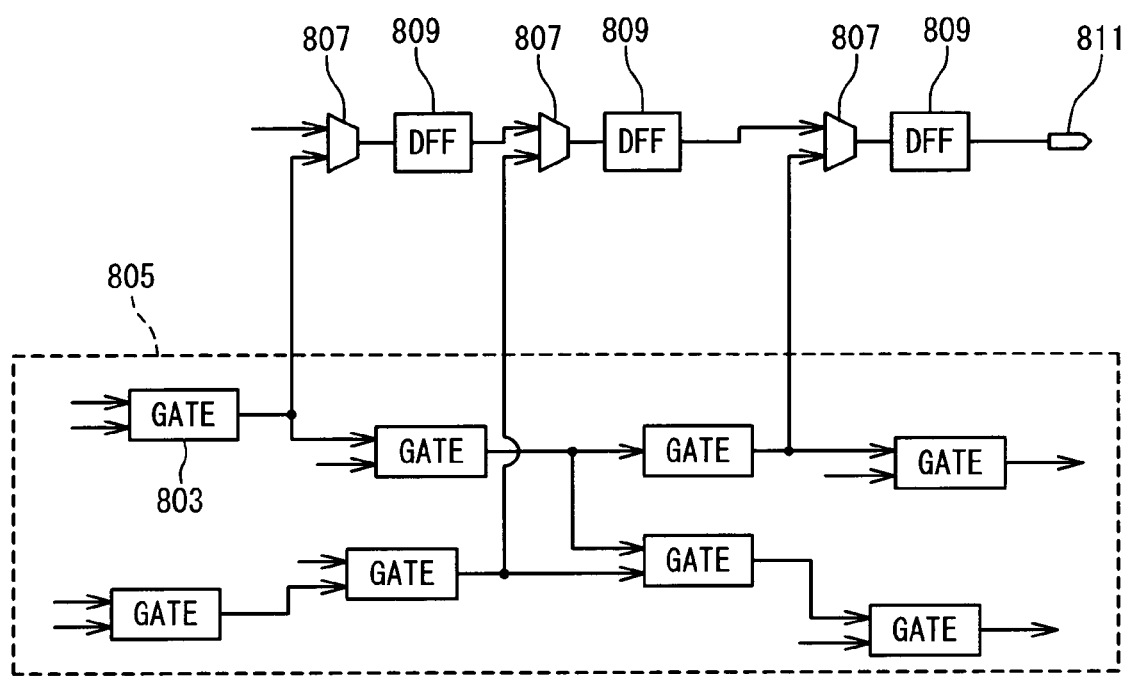
FIG. 12 is a circuit diagram for explaining an example of a method of outputting a potential in a circuit to the outside of the circuit.

Furthermore, potential of the observation point can be output to the outside of the integrated circuit, by employing a shift register used in a scan test circuit. According to a circuit configuration shown in FIG. 12, for example, internal potential of a circuit 805 constituted by gate elements 803 is output to the outside of the integrated circuit by a shift register. The potential of an interconnection connecting between the gate elements 803 is supplied to a D-flip-flop (DFF) 809 through a multiplexer 807. When a clock is supplied to the D-flip-flop 809, the internal potential of the circuit 805 is latched by the D-flip-flop 809. Next, selection in the multiplexer 807 is switched, and then the clock is supplied to the D-flip-flop 809. In this case, a group of the D-flip-flops 809 functions as a shift register, and the potentials latched by the respective D-flip-flops 809 are output in order through an output terminal 811. By measuring a potential waveform at the output terminal 811, the internal potential of the circuit 805 can be obtained. Alternatively, a data compression circuit can be additionally provided in front of the output terminal 811 shown in FIG. 12. In this case, the amount of data output to the outside is reduced, which is preferable.

(8) Step S215

Next, whether or not it is necessary to continuously insert another observation point is judged. If another observation point is to be added, then the processing returns to the foregoing Step S203, and the same processing is repeated. Otherwise, the processing goes to Step S217. In the present step, various judging methods can be considered. For example, the insertion of the observation point is stopped if the calculated failure-analyticity M becomes equal to or smaller than a predetermined value. In other words, the insertion of the observation point is repeated until the calculated failure-analyticity M becomes equal to or smaller than the predetermined value. In this case, the parameter M of the completed circuit is almost constant. That is, the failure-analyticity M always settles down to a comparable level, which is an advantageous point.

Figure 13:
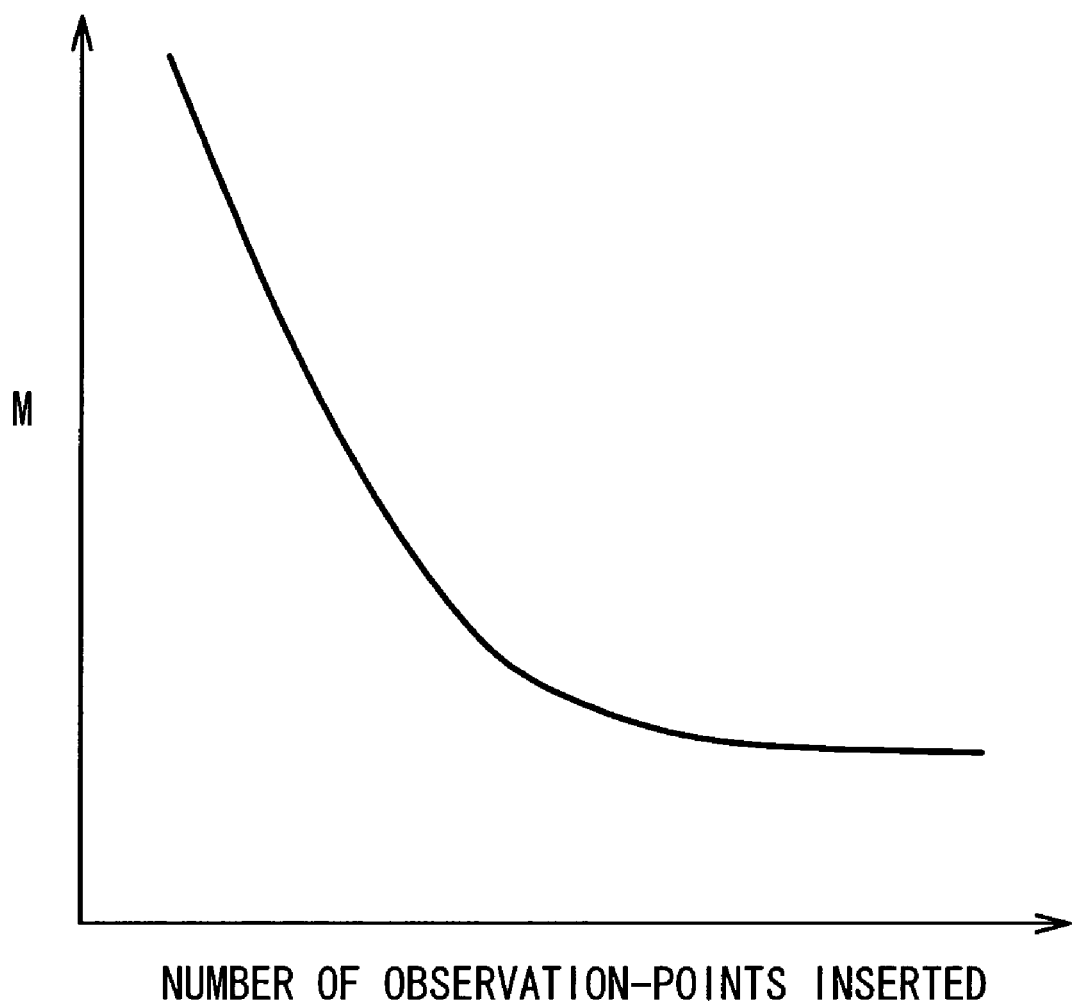
FIG. 13 is a graph illustrating a relationship between the number of observation points inserted and failure analyticity M.

It should be noted that there is a relationship between the number of observation points inserted and the parameter M, as shown in FIG. 13. It can be seen from FIG. 13 that reduction rate of the parameter M due to the insertion decreases as the number of observation points inserted becomes larger. Therefore, the insertion of the observation point may be repeated until the reduction rate of the parameter M becomes lower than a predetermined value. In this case, the insertion of the observation point is stopped when the effect of the insertion becomes small. Therefore, the effect of improvement of the failure-analyticity per one observation point is increased, which is an advantageous point.

Alternatively, the insertion of the observation point can be repeated until the number of inserted observation points becomes equal to a predetermined value. Alternatively, the insertion of the observation point can be stopped if a ratio of an observation point area to a chip area reaches to a predetermined value.

(9) Step S217: Interconnection Routing

Next, the routing module 115 reads out the netlist NET and the placement data ARR in which at least one observation point is inserted from the storage unit 103. The routing module 115 performs an interconnection routing based on the netlist NET and the placement data ARR. The interconnection routing is a processing for adding geometry data of interconnections between the cells to the design diagram in which the cells are placed. The interconnection routing is performed in accordance with the connection information indicated by the netlist NET. As a result of the Step S217, the layout data LAY indicating the circuit layout is generated.

(10) Step S219: Output of Layout Data

Finally, the completed layout data LAY is output by the output unit 117. The layout data LAY is input to an integrated circuit manufacturing apparatus. As a result, an integrated circuit with the improved failure-analyticity is manufactured. If the EB-measurement test pad or the LVP-measurement element is used as the observation-point, information indicating correspondence between a pad coordinate and a node name is output together with the layout data LAY.

As described above, according to the present embodiment, the judgment module 111 decides the target node based on the node number $J_i$. For example, it is highly possible that the probability of fault occurrence in an equivalent fault class $G_i$ having the maximum node number $J_i$ takes a maximum value among all the equivalent fault classes. Therefore, the judgment module 111 can select the target node from the equivalent fault class $G_i$ having the maximum node number $J_i$. By inserting the observation point preferentially into the equivalent fault class including a lot of equivalent fault nodes, it is possible to "efficiently" reduce the number of fault candidates as a whole. In other words, it is possible to improve the failure-analyticity with fewer observation points.

More specifically, the judgment module 111 calculates the parameter $D_i$ related to the equivalent fault class $G_i$ (see equation (4)) The parameter $D_i$ depends on the node number $J_i$ and the probability $P_i$. The judgment module 111 calculates the parameter M from the parameter $D_i$ (see equation (3)), and decides the target node such that the parameter M is reduced due to the insertion of the observation point. Preferably, the judgment module 111 selects the target node from one equivalent fault class $G_i$ that has the maximum parameter $D_i$ among all the equivalent fault class. The probability $P_i$ can be determined in various ways depending on a model. For example, the probability $P_i$ depends on the interconnection length in the equivalent fault class $G_i$, and it is highly possible that the probability $P_i$ is high with respect to one equivalent fault class $G_i$ that has the maximum interconnection length. Such the equivalent fault class $G_i$ corresponds to an equivalent fault class having a large parameter $D_i$. Therefore, the judgment module 111 can select the target node preferentially from the equivalent fault class $G_i$ that has the maximum interconnection length.

According to the present invention, as described above, the observation point is preferentially inserted into an equivalent fault class $G_i$ that has relatively large parameter $D_i$. As a result, the failure-analyticity can be improved "efficiently". That is, the failure-analyticity is improved even with the small number of observation points. In other words, it is possible to optimize the observation-point insertion positions and to facilitate the failure analysis with the small number of observation points.

2. Second Embodiment

Figure 14:
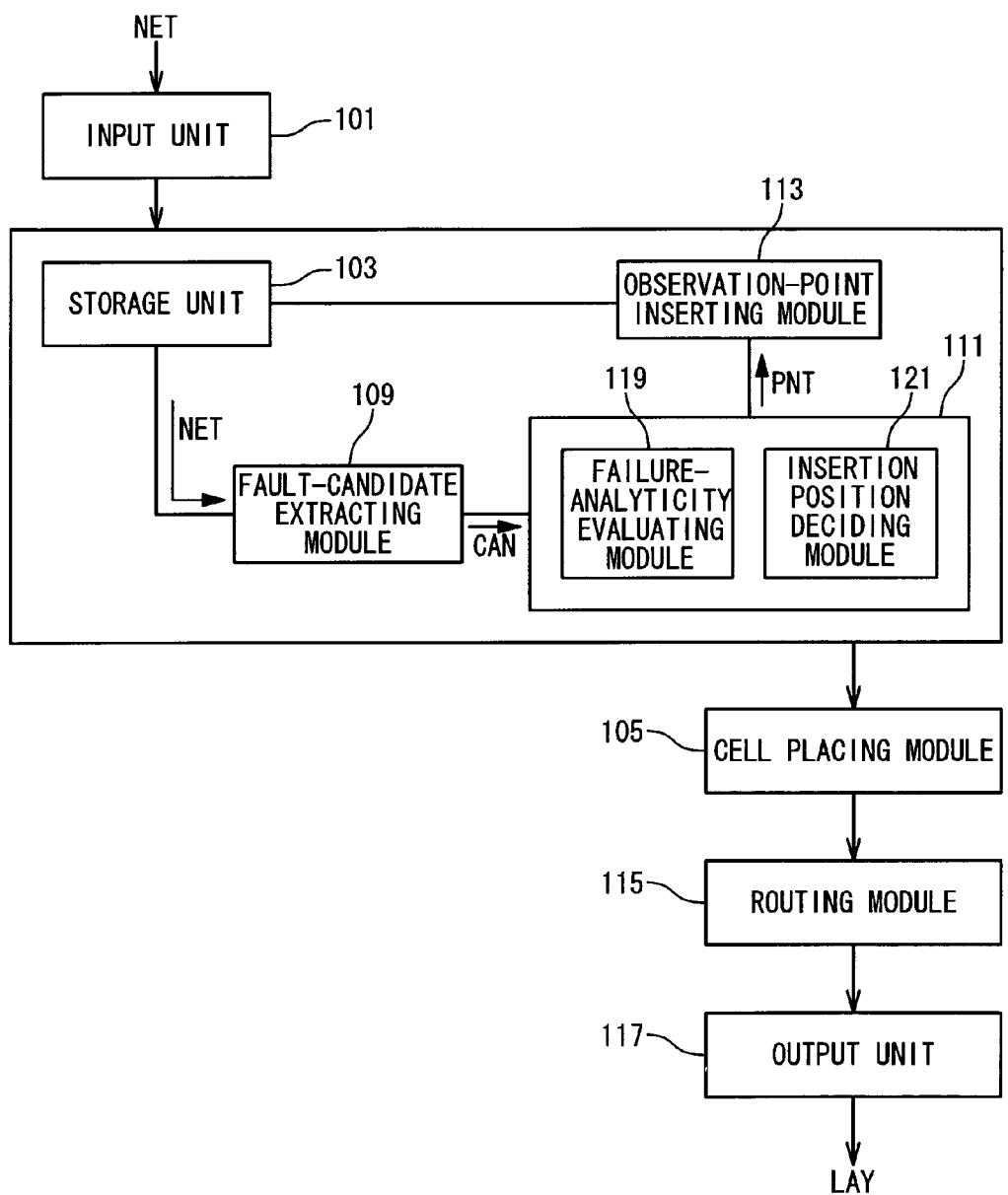
FIG. 14 is a block diagram showing a configuration of a circuit design system according to a second embodiment of the present invention.

FIG. 14 is a block diagram showing a configuration of a circuit design system (a failure analysis facilitating design system) according to a second embodiment of the present invention. The circuit design system according to the present embodiment has the input unit 101, the storage unit 103, the cell placing module 105, the fault-candidate extracting module 109, the judgment module 111, the observation-point inserting module 113, the routing module 115, and the output unit 117. In FIG. 14, the same reference numerals are given to the same components as those described in the first embodiment, and an overlapping description will be appropriately omitted.

The second embodiment differs from the first embodiment in that the circuit design system does not include the inter-cell distance extracting module 107. Furthermore, in the second embodiment, the cell placing module 105 places cells after all the necessary observation points are inserted.

Figure 15:
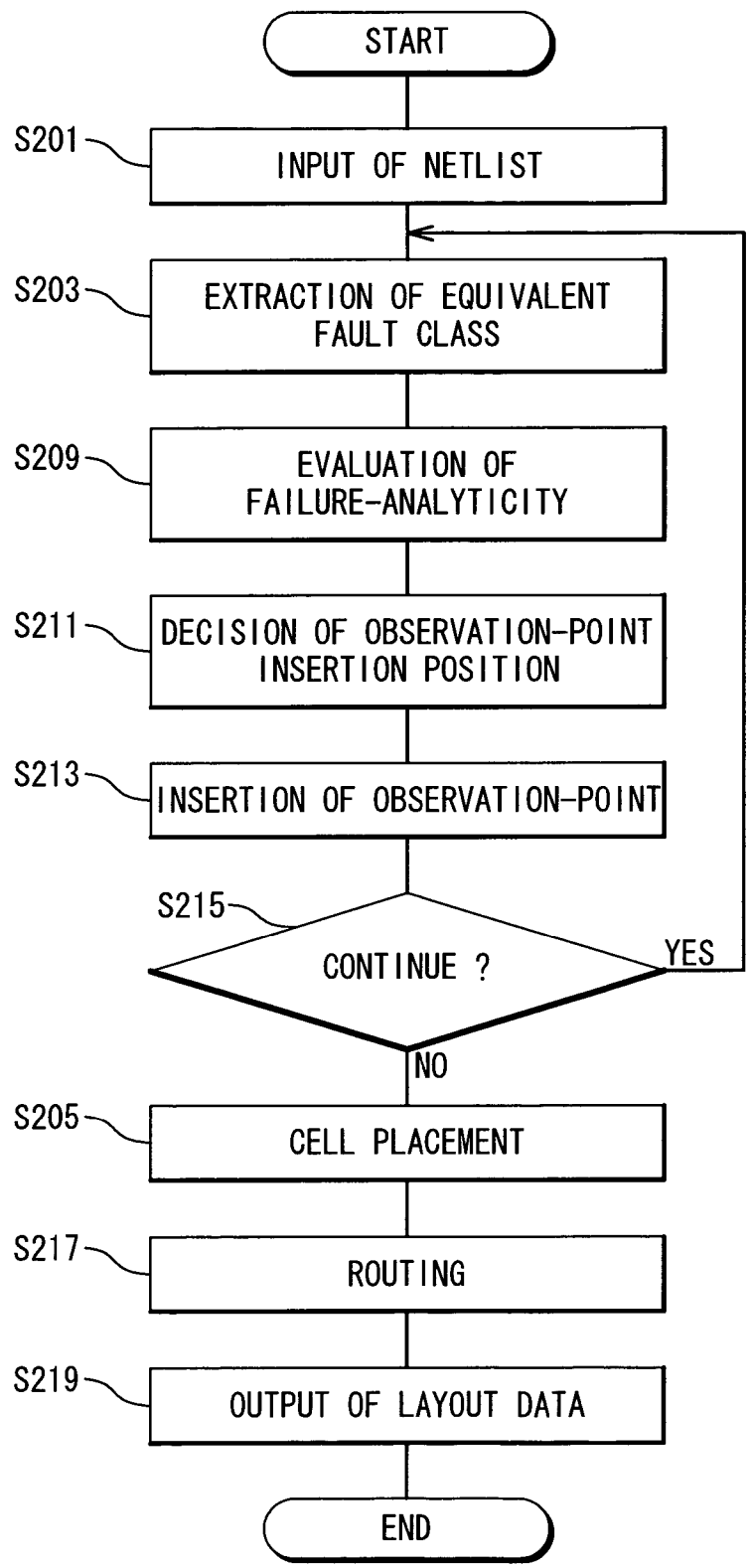
FIG. 15 is a flowchart showing a circuit design method according to the second embodiment.

FIG. 15 is a flowchart showing a circuit design method according to the present embodiment. The processing according to the present embodiment will be described in detail referring to the flowchart shown in FIG. 15 and the configuration shown in FIG. 14. The description on the same processing as in the first embodiment will be appropriately omitted.

First, the netlist NET is input and stored in the storage unit 103 (Step S201). Similarly to the first embodiment, the fault-candidate extracting module 109 extracts the equivalent fault classes $G_i$ from the netlist NET and outputs the fault-candidate data CAN to the judgment module 111 (Step S203). The cell placement (Step S205) is performed later on. The extraction of the inter-cell distances (Step S207) is not performed. Next, the failure-analyticity M is calculated (Step S209). According to the present embodiment, the following equation (6) is used to calculate the above-mentioned probability $P_i$ related to a certain equivalent fault class $G_i$.

$$P_i = \frac{1}{2} \cdot \frac{J_i}{J_{all}} \qquad (6)$$

In the equation (6), $J_{all}$ denotes a sum of the node numbers $J_i$ of all the equivalent fault classes $G_i$, and is expressed by the following equation (7).

$$J_{all} = \sum_{i=1}^{I} J_i \qquad (7)$$

The numerator in the equation (6) is the node number $J_i$ of the certain equivalent fault class $G_i$. According to the present embodiment, the judgment module 111 calculates the probability $P_i$ related to the equivalent fault class $G_i$ as a value that depends on the node number $J_i$. This corresponds to a case where the interconnection length $L_{ij}$ of each node used in the first embodiment is assumed to be equal. Instead of the above-mentioned $J_{all}$, a total number of nodes included in the whole of the design-target circuit may be used in the above equation (6).

Next, the parameter $D_i$ is calculated in accordance with the foregoing equation (4), and the parameter M (the failure-analyticity) is calculated in accordance with the foregoing equation (3). Thereafter, the insertion position deciding module 121 of the judgment module 111 decides the position (target node) into which at least one observation point is inserted, in the same manner as in the first embodiment (Step S211). Also similarly to the first embodiment, the observation point inserting module 113 inserts the observation point into the netlist NET and updates the netlist NET (Step S213).

Then, the Step S215 is performed. After the insertion of all the necessary observation points is completed, the cell placement is performed (Step S205). At this time, the cell placing module 105 places (arranges) the cells included in the design-target circuit by using the netlist NET into which the observation points are inserted. Subsequently, the routing module 115 performs the interconnection routing (Step S217). Through the Step S205 and the Step S207, the layout data LAY is generated from the netlist NET. The generated layout data LAY is output by the output unit 117 (Step S219).

According to the present embodiment, the same effects as in the first embodiment can be obtained. That is, the failure analysis can be facilitated with the smaller number of observation points. Furthermore, as an additional effect, the processing amount can be reduced. The reason is that the information on the inter-cell distances is not used in calculating the parameter M and hence the processing for extracting the inter-cell distances is not necessary.

Moreover, according to the foregoing first embodiment, if an available region is not present near the circuit region to be observed on inserting the observation point, it is necessary to change the cell placement to secure the insertion region. According to the second embodiment, however, all the observation points are inserted before the cell placing, and thus it is unnecessary to change the cell placement every time the observation point is inserted. Therefore, the processing can be simplified.

3. Third Embodiment

Figure 16:
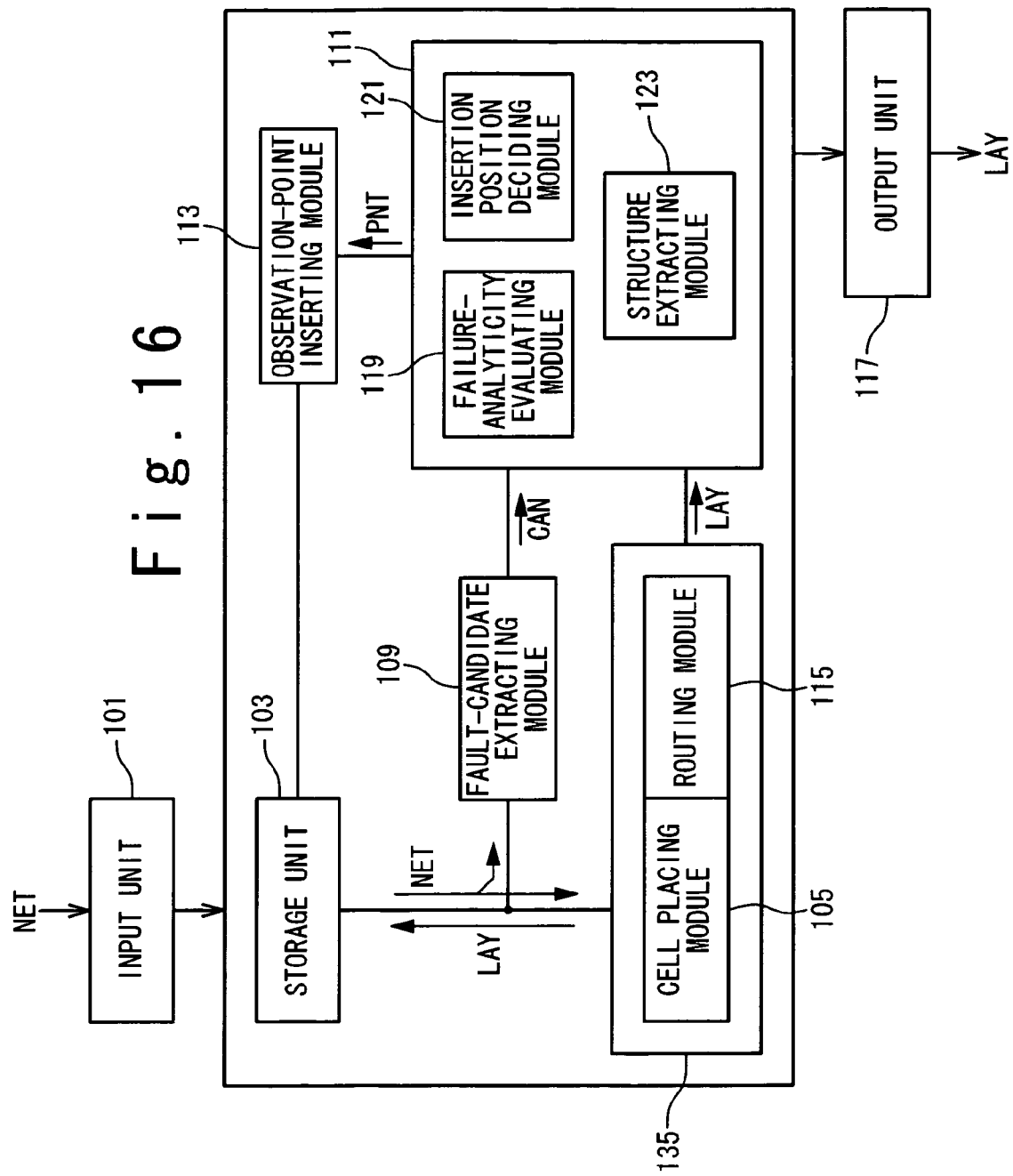
FIG. 16 is a block diagram showing a configuration of a circuit design system according to a third embodiment of the present invention.

FIG. 16 is a block diagram showing a configuration of a circuit design system (a failure analysis facilitating design system) according to a third embodiment of the present invention. The circuit design system according to the present embodiment has the input unit 101, the storage unit 103, the fault-candidate extracting module 109, a layout module 135, a judgment module 111, the observation-point inserting module 113, and the output unit 117. The layout module 135 includes the cell placing module 105 and the routing module 115. The judgment module 111 includes not only the failure-analyticity evaluating module 119 and the insertion position deciding module 121 but also a structure extracting module 123. In FIG. 16, the same reference numerals are given to the same components as those described in the first embodiment, and an overlapping description will be appropriately omitted.

The third embodiment differs from the first embodiment in that the circuit design system does not include the inter-cell distance extracting module 107. Instead, the structure extracting module 123 is provided in the judgment module 111 according to the third embodiment. The structure extracting module 123 extracts "structure information" such as an area of diffusion regions, the numbers of contacts and vias, a length of a gate-poly interconnection, and a length of a metal interconnection with respect to each equivalent fault class $G_i$. To calculate the parameter M (the failure-analyticity), the structure information is used in place of the inter-cell distance information. Here, in order to extract the structure information, the layout data LAY indicating the circuit layout is necessary. Therefore, the layout module 135 (including the cell placing module 105 and the routing module 115) generates the layout data LAY before the structure extraction processing, and outputs the layout data LAY to the judgment module 111 (the structure extracting module 123).

Figure 17:
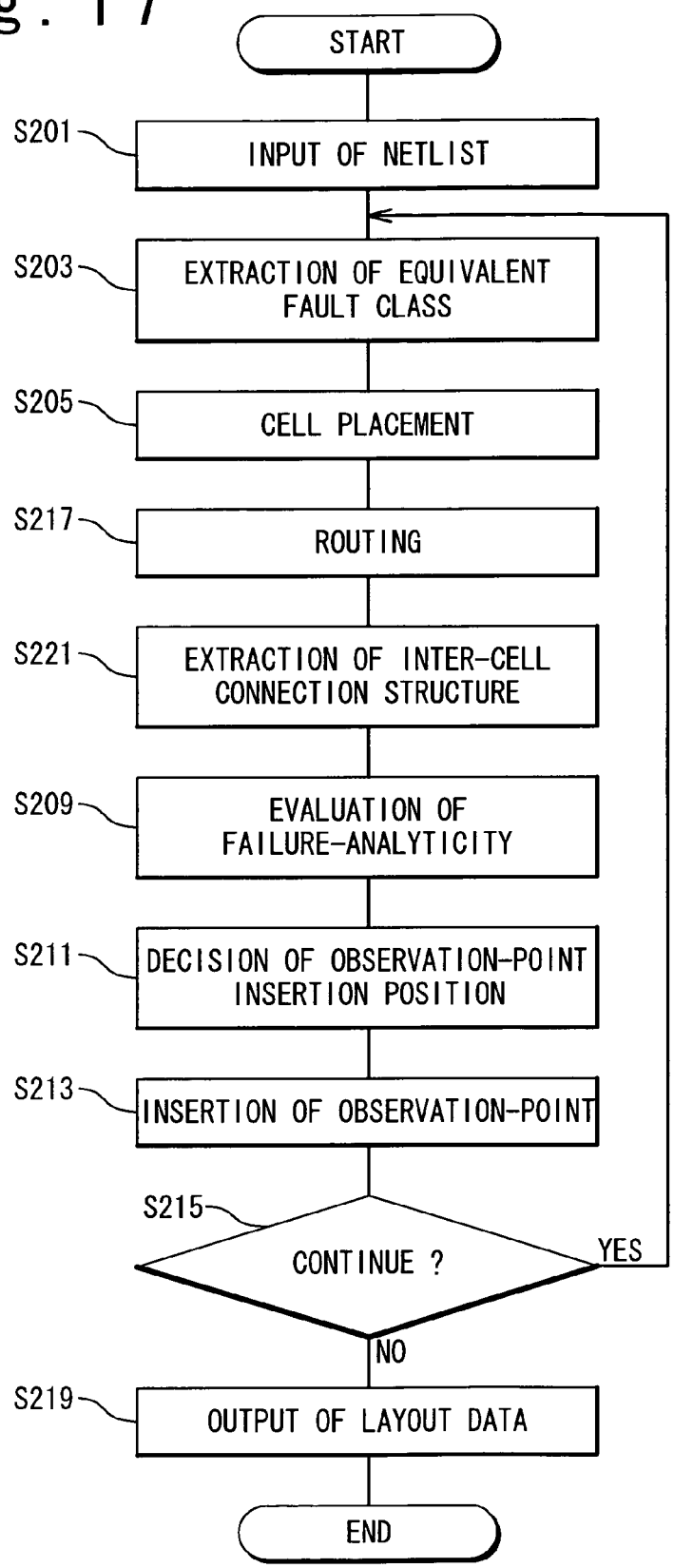
FIG. 17 is a flowchart showing a circuit design method according to the third embodiment.

FIG. 17 is a flowchart showing a circuit design method according to the present embodiment. The processing according to the present embodiment will be described in detail referring to the flowchart shown in FIG. 17 and the configuration shown in FIG. 16. The description on the same processing as in the first embodiment will be appropriately omitted.

First, the netlist NET is input and stored in the storage unit 103 (Step S201). Similarly to the first embodiment, the fault-candidate extracting module 109 extracts the equivalent fault classes $G_i$ from the netlist NET and outputs the fault-candidate data CAN to the judgment module 111 (Step S203). Meanwhile, the layout module 135 determines the layout of the design-target circuit with reference to the netlist NET stored in the storage unit 103. More specifically, the cell placing module 105 places (arranges) the cells included in the design-target circuit (Step S205), and then the routing module 115 determines the interconnection routing (Step S217). The layout data LAY thus generated is stored in the storage unit 103 and also output to the judgment module 111.

The judgment module 111 receives the fault-candidate data CAN from the fault-candidate extracting module 109 and the layout data LAY from the layout module 135. Then, the structure extracting module 123 of the judgment module 111 first extracts an inter-cell connection structure with reference to the fault-candidate data CAN and the layout data LAY (Step S221). The Step S221 will now be described in detail.

First, a data indicating fault occurrence rates $R_1$ to $R_K$ with respect to a plurality kinds of structures $X_1$ to $X_K$ (K is an integer equal to or greater than 1) is prepared. The plurality kinds of structures $X_k$ (k is an integer not less than 1 and not greater than K) include a diffused region, a gate-poly interconnection, a contact, a via, a metal interconnection and the like. For example, FIG. 18 conceptually shows the data indicting the fault occurrence rate $R_1$ to $R_8$ with respect to eight kinds of structures. The data shown in FIG. 18 is statistically obtained based on products manufactured in the past. For example, the number of samples determined as defective products by a test is set as a population parameter, and which of the structures includes the fault that causes the defect is investigated. The data indicating the fault occurrence rate $R_k$ is stored in the storage unit 103 in advance.

Next, parameters $S_{k,i}$ respective of which indicate amount of the structures $X_k$ in the equivalent fault class $G_i$ are calculated. FIG. 19 is a table showing the parameters $S_{1,i}$ to $S_{8,i}$ with respect to the structures shown in FIG. 18. For example, the parameter $S_{1,i}$ indicates an area of the diffusion layers included in the equivalent fault class $G_i$. The parameter $S_{2,i}$ indicates a total length of the gate-poly interconnections included in the equivalent fault class $G_i$. The parameter $S_{3,i}$ indicates the number of contacts included in the equivalent fault class $G_i$. The parameter $S_{4,i}$ indicates a total length of first metal interconnections included in the equivalent fault class $G_i$. For example, when lengths of the first metal interconnections of the respective nodes included in the equivalent fault class $G_i$ are $L_{i1}, L_{i2} \ldots$ and $L_{iJi}$, the parameter $S_{4,i}$ is given by the following equation (8).

$$S_{4,i} = \sum_{j=1}^{J_i} L_{ij} \qquad (8)$$

In this manner, the structure extracting module 123 generates a structure data indicating the parameters $S_{k,i}$ as shown in FIG. 19. Next, the failure-analyticity evaluating module 119 of the judgment module 111 calculates the failure-analyticity M with reference to the above-mentioned structure data (Step S209). According to the present embodiment, the probability $P_i$ related to a certain equivalent fault class $G_i$ is calculated based on the above-mentioned parameters $S_{k,i}$. More specifically, the failure-analyticity evaluating module 119 calculates the probability $P_i$ in accordance with the following equation (9).

$$P_i = \frac{1}{2} \cdot \sum_k \left( R_k \frac{S_{k,i}}{S_{k,all}} \right) \quad (9)$$

In the equation (9), $S_{k,\,all}$ denotes a sum of the parameters $S_{k,\,i}$ with respect to all the equivalent fault classes $G_i$, and is expressed by the following equation (10).

$$S_{k,all} = \sum_{i=1}^{I} S_{k,i} \quad (10)$$

The product of the parameter $S_{k,\,i}$ and the fault occurrence rate $R_k$ shown in FIG. 18 appears at the numerator in the equation (9). After the product is obtained for each structure $X_k$, a sum of the products with respect to all the structures $X_1$ to $X_K$ is calculated. According to the present embodiment, the judgment module 111 calculates the probability $P_i$ related to the equivalent fault class $G_i$ as a value that depends on the calculated sum. Instead of the above-mentioned $S_{k,\,all}$, a total amount of the structures $X_k$ included in the whole of the design-target circuit may be used in the above equation (9).

Next, the parameter $D_i$ is calculated in accordance with the foregoing equation (4), and the parameter M (the failure-analyticity) is calculated in accordance with the foregoing equation (3). Thereafter, the insertion position deciding module 121 of the judgment module 111 decides the position (target node) into which at least one observation point is inserted, in the same manner as in the first embodiment (Step S211). Also similarly to the first embodiment, the observation point inserting module 113 inserts the observation point into the netlist NET and updates the netlist NET. Furthermore, the observation-point inserting module 113 inserts the observation point into the layout data LAY stored in the storage unit 103 and updates the layout data LAY (Step S213). Then, the Step S215 is performed. After the insertion of all the necessary observation points is completed, the layout data LAY is output by the output unit 117 (Step S219).

According to the present embodiment, the same effects as in the first embodiment can be obtained. That is, the failure analysis can be facilitated with the smaller number of observation points. Furthermore, as an additional effect, accuracy of the calculated failure-analyticity M is improved. The reason is that, when the probability $P_i$ is calculated, not only the influence of the inter-cell distances but also the influences of the number of vias, the number of contacts and the like included in the inter-cell interconnections are considered. For example, even when the inter-cell distance is the same, the number of vias through which the inter-cell interconnection passes can be different. Depending on the number of vias, the fault occurrence rate changes. In the foregoing first embodiment, the failure-analyticity M is evaluated based only on the inter-cell distances, so that the change in the fault occurrence rate due to the variation of the number of vias can not be considered. According to the third embodiment, however, it is possible to insert the observation point preferentially into the interconnection including a lot of vias in which the fault is likely to occur.

4. Fourth Embodiment

According to a fourth embodiment of the present invention, a plurality of observation points are inserted into one target node. The fourth embodiment can be combined with each of the above-described first to third embodiments. In the fourth embodiments, an overlapping description will be appropriately omitted.

In an integrated circuit, some nodes have an interconnection whose length is as large as about several millimeters. Therefore, even if a fault node is specified, it may be difficult to locate where in the interconnection of the specified fault node the cause of the fault exists. In the fourth embodiment, the observation-point inserting module 113 inserts a plurality of observation points into the target node having a particularly large interconnection length. The number of observation points inserted into one target node is set in accordance with, for example, the interconnection length of the one target node. Alternatively, a plurality of observation points can be sequentially inserted into the target node such that an interconnection length between the adjacent observation points does not exceed a predetermined limit value.

Figure 20A:
FIG. 20A is a circuit diagram for explaining a processing according to a fourth embodiment of the present invention.
Figure 20B:
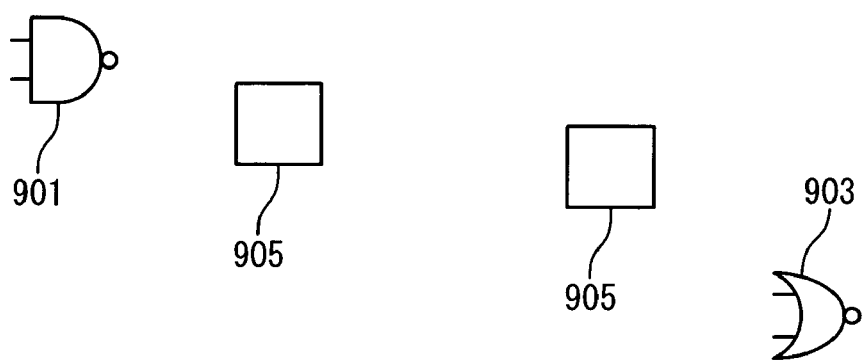
FIG. 20B is a circuit diagram for explaining a processing according to the fourth embodiment.
Figure 20C:
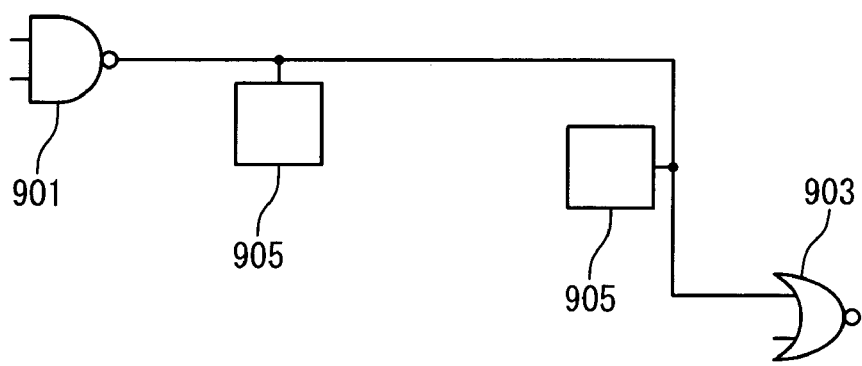
FIG. 20C is a circuit diagram for explaining a processing according to the fourth embodiment.

FIGS. 20A to 20C are circuit diagrams for conceptually explaining the insertion of the observation points (Step S213) according to the present embodiment. First, the cells (a NAND element 901 and a NOR element 903) are placed as shown in FIG. 20A. An output of the NAND element 901 is to be connected to an input of the NOR element 903. When two observation points 905 are inserted between the cells, an arrangement shown in FIG. 20B is obtained. As illustrated in FIG. 20B, it is preferable that the observation points 905 are so spaced as to give even intervals as possible. In this case, it becomes easier to narrow down the fault position. After that, the interconnection routing is performed between the cells 901 and 903, and a layout shown in FIG. 20C is obtained.

According to the fourth embodiment, the same effects as in the foregoing embodiments can be obtained. Furthermore, even if the interconnection length is large and hence it may be difficult to locate the fault position in the interconnection, it is possible to easily find the fault by providing the plurality of observation points.

5. Fifth Embodiment

Figure 21:
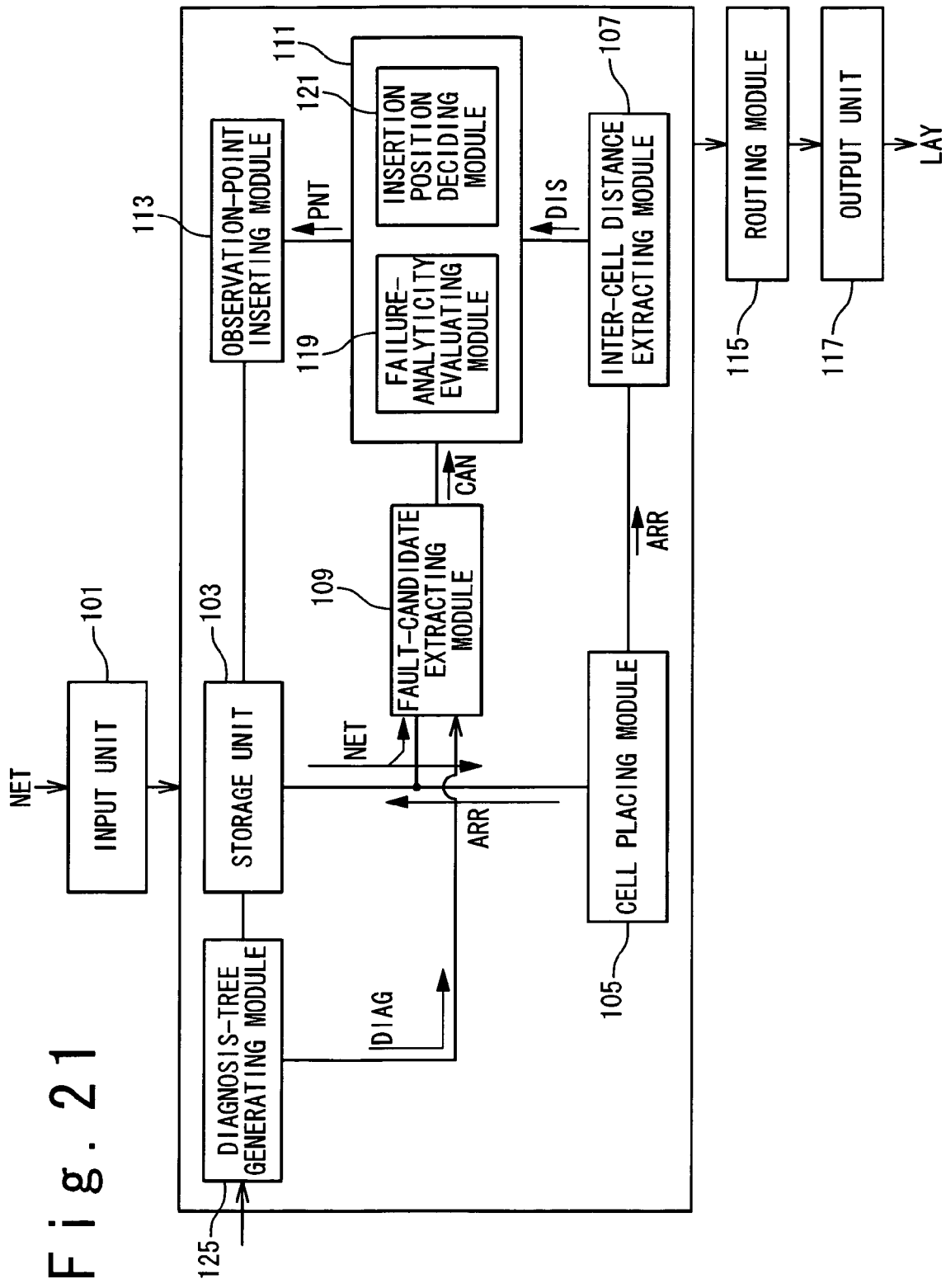
FIG. 21 is a block diagram showing a configuration of a circuit design system according to a fifth embodiment of the present invention.

FIG. 21 is a block diagram showing a configuration of a circuit design system (a failure analysis facilitating design system) according to a fifth embodiment of the present invention. The circuit design system according to the present embodiment has the input unit 101, the storage unit 103, the cell placing module 105, the inter-cell distance extracting module 107, the fault-candidate extracting module 109, the judgment module 111, the observation-point inserting module 113, the routing module 115, the output unit 117, and the diagnosis-tree generating module 125. In FIG. 21, the same reference numerals are given to the same components as those described in the first embodiment, and an overlapping description will be appropriately omitted.

The fifth embodiment differs from the first embodiment in that the circuit design system additionally includes the diagnosis-tree generating module 125. The diagnosis-tree generating module 125 generates a "diagnosis-tree" of the design-target circuit by using a plurality kinds of test patterns. The diagnosis-tree generating module 125 supplies a diagnosis-tree data DIAG indicating the generated diagnosis-tree to the fault-candidate extracting module 109. In the present embodiment, the fault-candidate extracting module 109 extracts the equivalent fault classes $G_i$ from the netlist NET with reference to the diagnosis-tree indicated by the diagnosis-tree data DIAG.

Figure 22:
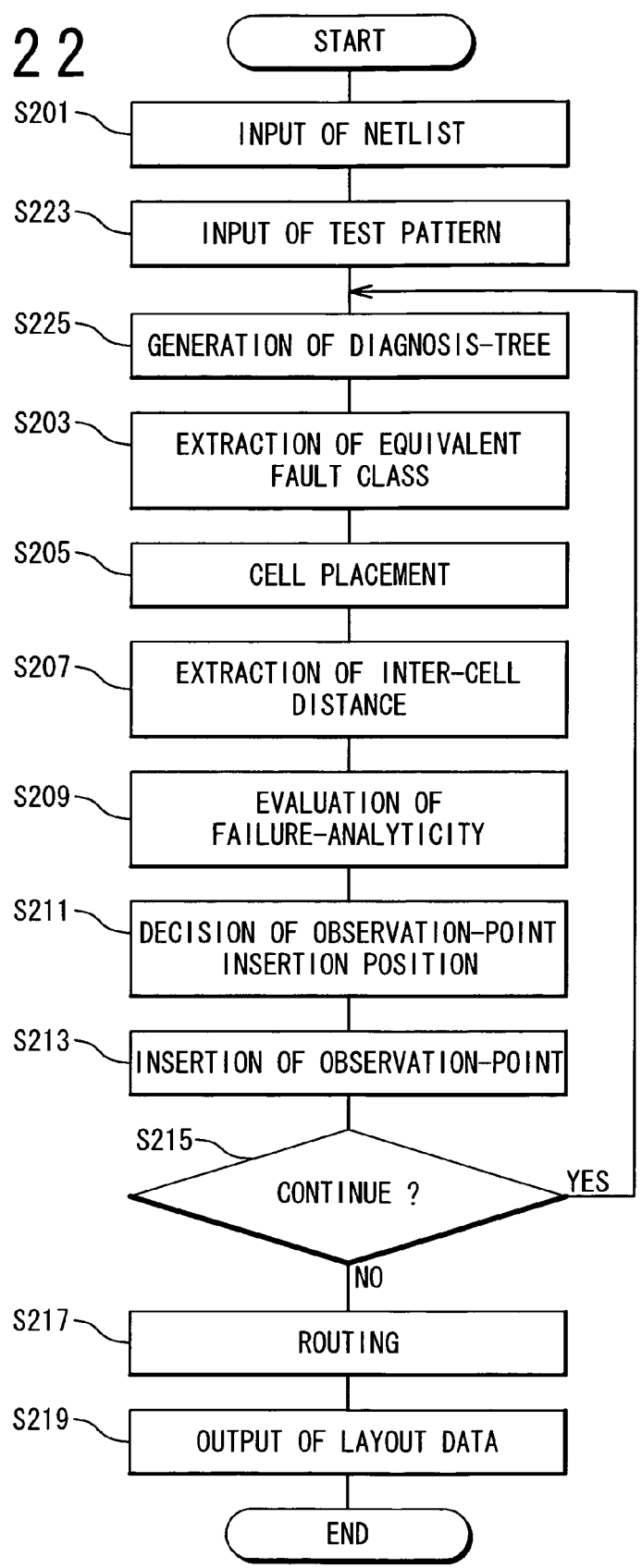
FIG. 22 is a flowchart showing a circuit design method according to the fifth embodiment.

FIG. 22 is a flowchart showing a circuit design method according to the present embodiment. The processing according to the present embodiment will be described in more detail referring to the flowchart shown in FIG. 22 and the configuration shown in FIG. 21. The description on the same processing as in the first embodiment will be appropriately omitted.

First, the netlist NET is input and stored in the storage unit 103 (Step S201). Also, test patterns for the circuit are input to the diagnosis-tree generating module 125 (Step S223). The diagnosis-tree generating module 125 generates a diagnosis-tree of the circuit from the input test patterns and the netlist NET (Step S225). The "diagnosis-tree" represents in a tree structure whether or not faults can be detected by each test vector, with regard to all the fault candidates present in the design-target circuit.

Figure 23:
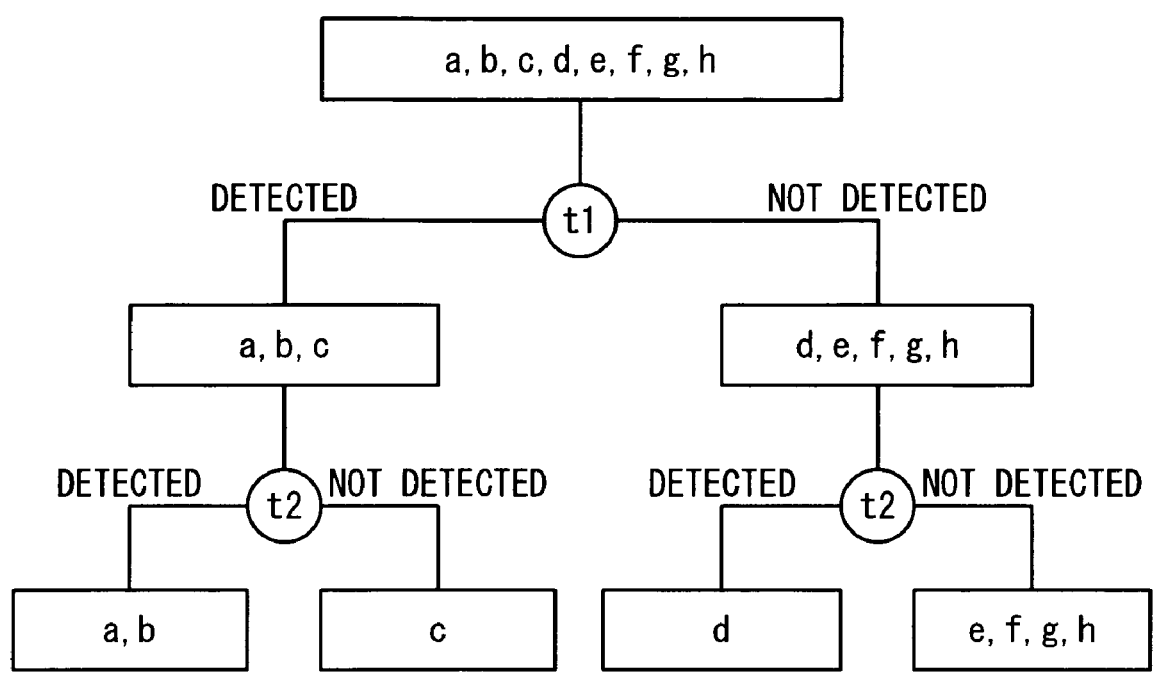
FIG. 23 is a schematic view illustrating an example of a diagnosis-tree with respect to a circuit.

FIG. 23 illustrates an example of the circuit diagnosis-tree. Eight fault candidates "a" to "h" are included in the root of the diagnosis-tree shown in FIG. 23. The diagnosis-tree shows that three faults "a" to "c" can be detected by a test vector t1, while the other faults "d" to "h" can not be detected by the test vector t1. Similarly, three faults "a", "b", and "d" can be detected by a test vector t2, while the other faults "c", "e", "f", "g", and "h" can not be detected by the test vector t2. Therefore, it can be seen that the faults "c" and "d" are the only faults whose positions can be detected by using the test vectors t1 and t2. If any of the fault candidates "a" and "b" is a true fault, the position of the true fault can not be specified. Therefore, the fault candidates "a" and "b" constitute an equivalent fault class. Similarly, the fault candidates "e", "f", "g", and "h" constitute an equivalent fault class.

The diagnosis-tree data DIAG indicating such a diagnosis-tree is generated by the diagnosis-tree generating module 125. Next, in the Step S203, the fault-candidate extracting module 109 extracts equivalent fault classes $G_1$, to $G_I$ with reference to the diagnosis-tree data DIAG. More specifically, a "leaf" including two or more fault candidates is retrieved from the diagnosis-tree indicated by the diagnosis-tree data DIAG (see FIG. 23). If a plurality of fault candidates are included in one leaf, the fault position can not be specified by the external measurement. Namely, those fault candidates constitute an equivalent fault class. In this manner, the fault-candidate extracting module 109 extracts the equivalent fault classes and generates the fault-candidate data CAN.

The subsequent procedures are the same as those in the first embodiment. It should be noted that the fifth embodiment can be also combined with any of the second to fourth embodiments.

Figure 5:
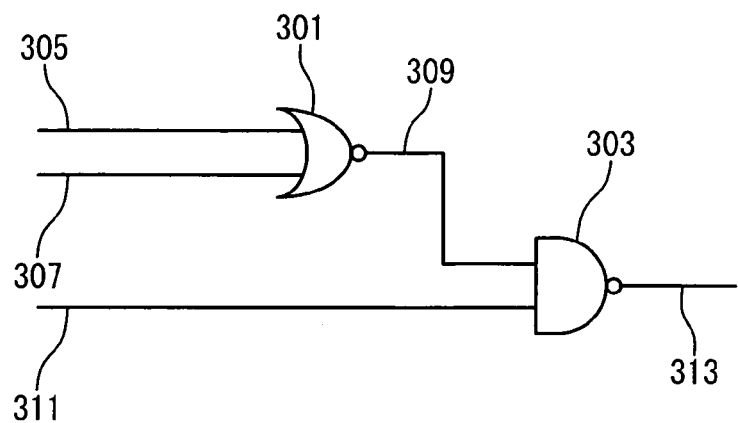
FIG. 5 is a circuit diagram for explaining equivalent fault class.

According to the fifth embodiment, the same effects as in the first embodiment can be obtained. Furthermore, the following effects can be obtained. As shown in FIG. 5, for example, a fault node included in a certain equivalent fault class is adjacent to another fault node included in the same equivalent fault class across one element. That is to say, the fault nodes congregate. However, if a redundant circuit is employed for the purpose of reducing delay or the like, even the fault nodes belonging to the same equivalent fault class may not be adjacent to each other. When equivalent faults are extracted from a circuit diagram, such equivalent faults as that are not adjacent to each other are hardly found and hence the observation point can not be provided in the equivalent faults. According to the present embodiment, however, it is possible by using the diagnosis-tree to find such equivalent faults as that are not adjacent to each other. By inserting the observation point into such an equivalent fault class, it is possible to further facilitate the failure analysis.

It should be noted that whether or not the position into which the observation point is inserted is good depends on the test patterns. The failure-analyticity can be improved by using test patterns capable of analyzing faults with higher resolution. Generally, a pattern length of a test pattern used for selection is compressed in order to reduce the test time, and failure analysis resolution of the test pattern is not so high. A method of improving the failure analysis resolution without changing the pattern length is disclosed in the following document: Kohei Miyase and Seiji Kajihara, "XID: Don't Care Identification of Test Patterns for Combinational Circuits", IEEE TRANSACTIONS ON COMPUTER-AIDED DESIGN OF INTEGRATED CIRCUITS AND SYSTEMS, VOL. 23, NO. 2, 2004. To employ the method is one of good ways to improve the failure analysis resolution of the test pattern.

6. Sixth Embodiment

According to a sixth embodiment of the present invention, the design-target circuit is designed based on the physical synthesis method. Even in the physical synthesis design method, the failure analysis can be facilitated by inserting the observation point into the circuit.

Figure 24:
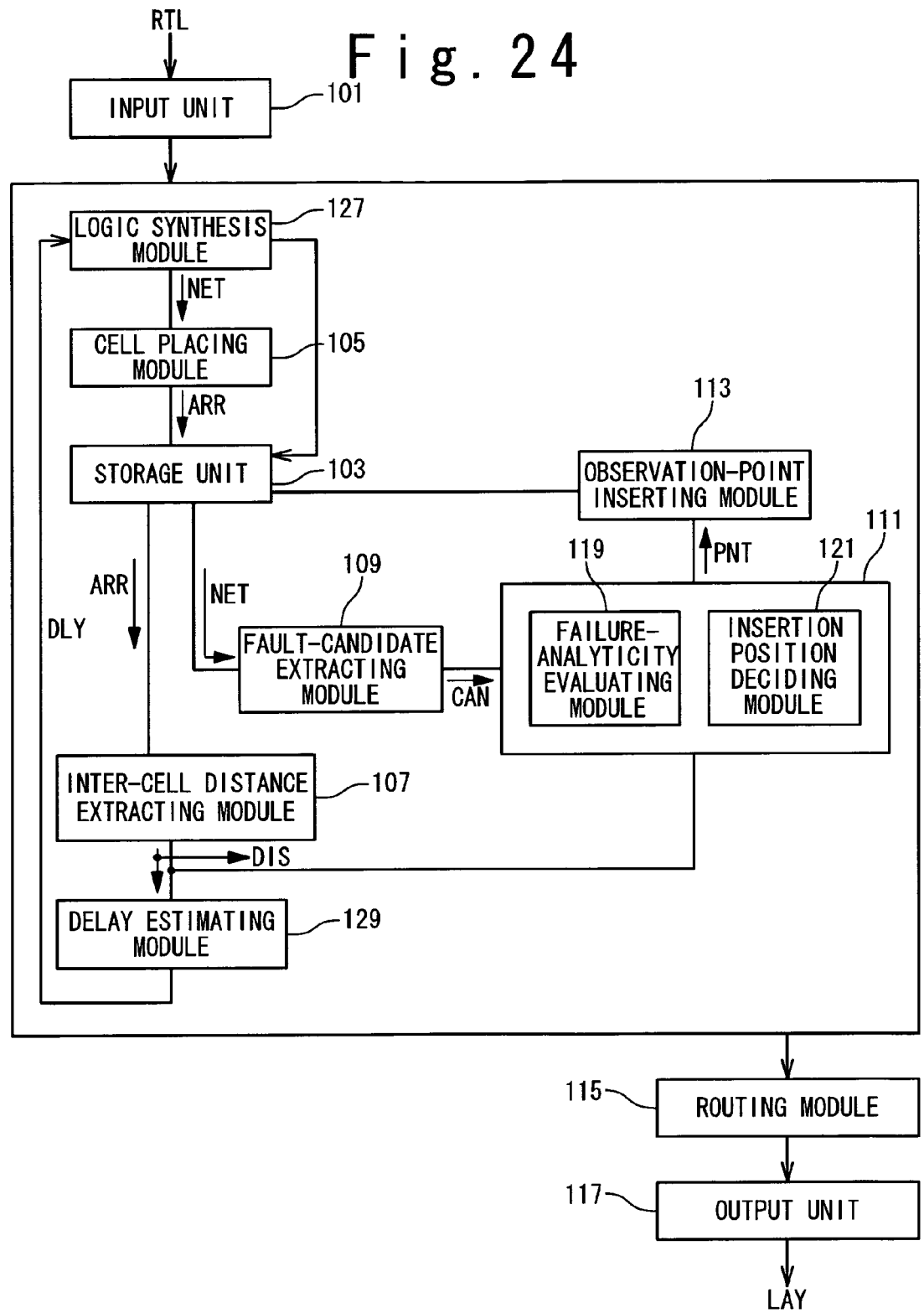
FIG. 24 is a block diagram showing a configuration of a circuit design system according to a sixth embodiment of the present invention.

FIG. 24 is a block diagram showing a configuration of a circuit design system (a failure analysis facilitating design system) according to the sixth embodiment. The circuit design system has the input unit 101, the storage unit 103, the cell placing module 105, the inter-cell distance extracting module 107, the fault-candidate extracting module 109, the judgment module 111, the observation-point inserting module 113, the routing module 115, the output unit 117, a logic synthesis module 127, and a delay estimating module 129. In FIG. 24, the same reference numerals are given to the same components as those described in the first embodiment, and an overlapping description will be appropriately omitted.

The input to the circuit design system according to the present embodiment is an RTL (Register Transfer Level) description indicating logic and function of the design-target circuit. The RTL description is expressed in an HDL (Hardware Description Language). The RTL description input by the input unit 101 is supplied to the logic synthesis module 127. The logic synthesis module 127 performs a logic synthesis of the RTL description to generate the netlist NET, and stores the netlist NET in the storage unit 103. The cell placing module 105 performs the cell placement immediately after the logical synthesis performed by the logic synthesis module 127. The delay estimating module 129 estimates delay time on the basis of inter-cell distance information. A delay time data DLY indicating the estimated delay time is fed back to the logic synthesis module 127. The delay time data DLY is used to verify whether or not the circuit generated by the logic synthesis can operate in a range of desired delay time.

Figure 25:
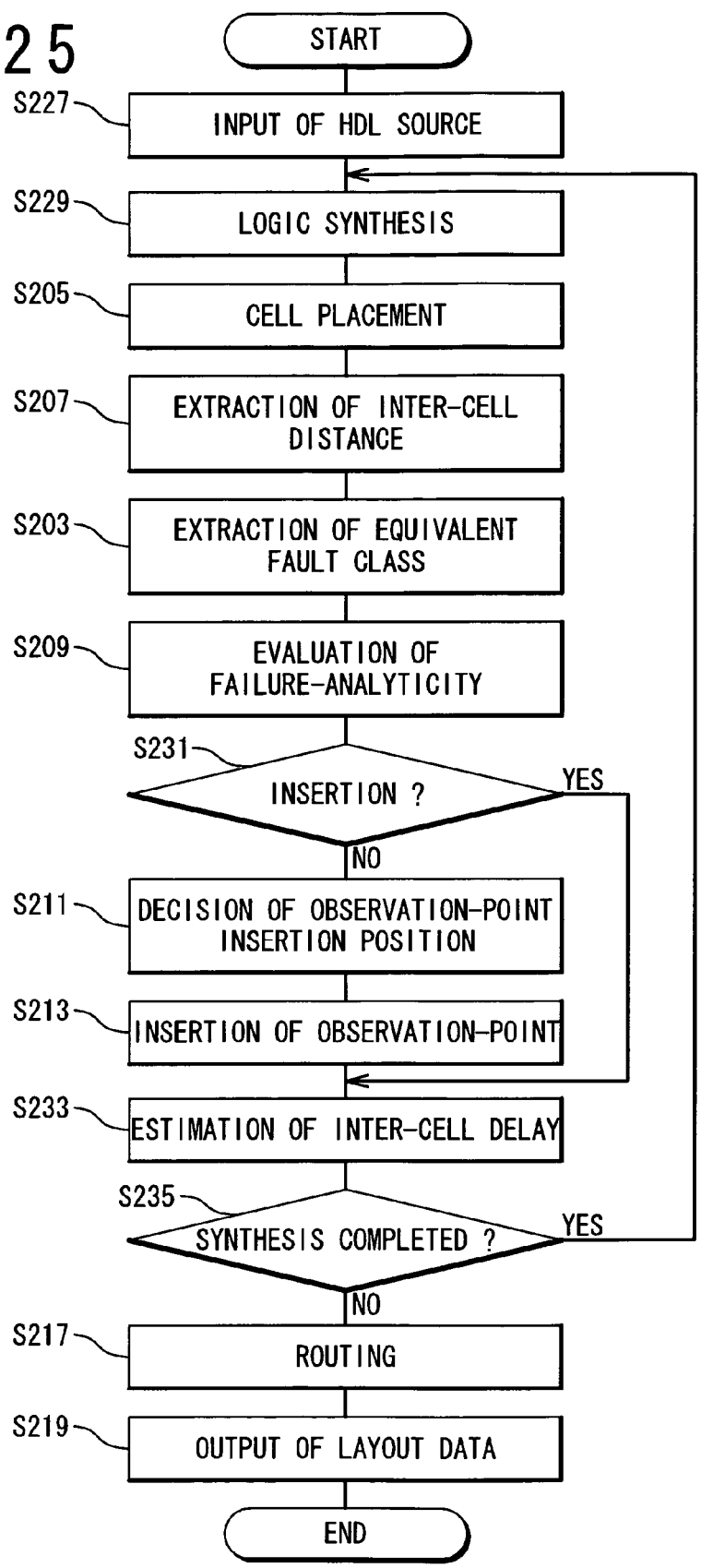
FIG. 25 is a flowchart showing a circuit design method according to the sixth embodiment.

FIG. 25 is a flowchart showing a circuit design method according to the present embodiment. The processing according to the present embodiment will be described in more detail referring to the flowchart shown in FIG. 25 and the configuration shown in FIG. 24. The description on the same processing as in the first embodiment will be appropriately omitted.

First, the RTL description (HDL source) expressed in the HDL is input (Step S227). The logic synthesis module 127 performs a logic synthesis of the RTL description (Step S229). It should be noted here that logic synthesis of the entire circuit is not performed all at once, as in the general physical synthesis method. After the logic synthesis of one to a few cells is performed, the processing goes to the next step S205 (cell placement). The netlist obtained by the logic synthesis of a partial RTL description of a part of the design-target circuit will be referred to as a "partial netlist NET" hereinafter. The logic synthesis module 127 outputs the generated partial netlist NET to the cell placing module 105 and also stored in the storage unit 103.

Next, the cell placing module 105 places (arranges) the cells included in the part of the design-target circuit with reference to the partial netlist NET (Step S205). As a result, the placement data ARR indicating the cell placement is generated and stored in the storage unit 103. Thereafter, similarly to the first embodiment, the inter-cell distance extracting module 107 extracts the inter-cell distances based on the placement data ARR to generate the inter-cell distance data DIS (Step S207). Furthermore, the fault-candidate extracting module 109 extracts the equivalent fault classes $G_i$ with reference to the partial netlist NET and generates the fault-candidate data CAN (Step S203).

After that, the failure-analyticity evaluating module 119 of the judgment module 111 calculates the probability $P_i$, the parameter $D_i$, and the parameter M based on the above-mentioned equations (1), (3), and (4), respectively (Step S209). The parameter $D_i$ indicates the failure-analyticity related to each equivalent fault class, and the parameter M indicates the sum of failure-analyticity related to all the equivalent fault classes. The interconnection length $L_{ij}$ is approximated based on the inter-cell distance data DIS, as in the first embodiment. At this moment, since the logic synthesis for the remaining part of the circuit is not performed yet, the total length $L_{all}$ in the equation (1) is not determined. However, the total length $L_{all}$ can be approximated by using such parameters as a chip size, the number of metal interconnection layers, and an interconnection width. It is considered that there is a relationship between those parameters and the total length $L_{all}$. For example, if the chip size is large or the number of metal interconnection layers is large, the total length $L_{all}$ is also large. If the interconnection width is reduced, the total length $L_{all}$ is increased. Therefore, if the relationship between the above parameters and the total length $L_{all}$ is known in advance based on previously designed products, the total length $L_{all}$ can be calculated by extrapolation. Alternatively, the logic synthesis, the cell placing, and the interconnection routing may be once performed normally without using the physical synthesis method, and then the total length $L_{all}$ may be calculated based on the result. It should be noted that even if the accuracy of the total length $L_{all}$ obtained at this moment is low, that is not problem, because the final number of observation points can be adjusted at the next step S231.

Next, the insertion position deciding module 121 judges whether the insertion of the observation point is necessary or not with respect to each equivalent fault class $G_i$ (Step S231). The judgment is made based on whether or not the parameter $D_i$ calculated in the Step S209 exceeds a predetermined threshold value. If the parameter $D_i$ exceeds the predetermined threshold value (Step S231; Yes), then the insertion position deciding module 121 decides the position into which the observation point is inserted (Step S211) and the observation-point inserting module 113 inserts the observation point into the decided position (Step S213), as in the first embodiment. On the other hand, if the parameter $D_i$ does not exceed the predetermined threshold value (Step S231; No), the processing goes to Step S233.

It is necessary to approximate the above-mentioned threshold value in advance by some way. To approximate the threshold value, a normal logic synthesis may be performed once without using the physical synthesis method. Thereafter, similarly to the first embodiment, the cells are placed and the parameter $D_i$ related to each equivalent fault class $G_i$ is calculated. It is assumed herein that the number of observation points to be inserted is n. In this case, n equivalent fault classes are extracted in ascending order of the parameter $D_i$, and a minimum parameter $D_i$ out of the n parameters $D_i$ can be set to the threshold value. Alternatively, the threshold value can be approximated by extrapolation using data on the previously designed products, because it is considered that there is a relationship between an optimum threshold value and such parameters as the chip size, the number of metal interconnection layers, and the interconnection width. It is necessary to decide the number of observation points in view of not only the failure-analyticity but also influence of the observation points on the chip area and the operating speed. It is therefore necessary to determine the optimum threshold value by trial and error to some extent.

Next, the delay estimating module 129 estimates the delay time of a signal based on the inter-cell distance data DIS, and generates the delay time data DLY indicating the estimated delay time (Step S233). This function of the delay estimating module 129 is generally included in software for the circuit design based on the physical synthesis method, and its detail is not described here. It should be noted that, if the observation point is inserted in the Step S213, it is necessary to consider influence of the load of the observation point itself on the delay time.

Next, it is judged whether the logic synthesis of the all HDL source is completed or not (Step S235). If there remains any part for which the logic synthesis is not yet performed (Step S235; No), the processing returns to the above-mentioned Step S229. At this time, the delay time data DLY generated in the Step S233 is fed back to the logic synthesis module 127. When performing the logic synthesis, the logic synthesis module 127 verifies whether or not the delay time indicated by the delay time data DLY falls within a desired range.

When the logic synthesis of the all HDL source is completed (Step S235; Yes), the routing module 115 performs the interconnection routing based on the netlist NET and the placement data ARR (Step S217). As a consequence, the layout data LAY generated is output by the output unit 117 (Step S219).

The concept according to the present embodiment can be combined with any of the foregoing first to fifth embodiments.

As described above, the circuit design system according to the present invention can be applied to the circuit design based on the physical synthesis method. As a comparison, according to the conventional technique described in the above-mentioned non-patent document, some observation points are appropriately eliminated after the observation points are once inserted into all the nodes within the circuit. Therefore, the netlist into which the observation points are inserted is limited to the netlist for which the logic synthesis is completed wholly. Thus, it is not possible to apply the conventional technique to the physical synthesis method in which the logic synthesis and the cell placement are performed simultaneously. On the other hand, according to the present invention, the netlist into which the observation point is inserted is not limited to such a netlist as for which the logic synthesis is completed wholly. The observation point can be inserted into such a netlist as for which the logic synthesis is completed partially.

7. Circuit Design Program

Figure 26:
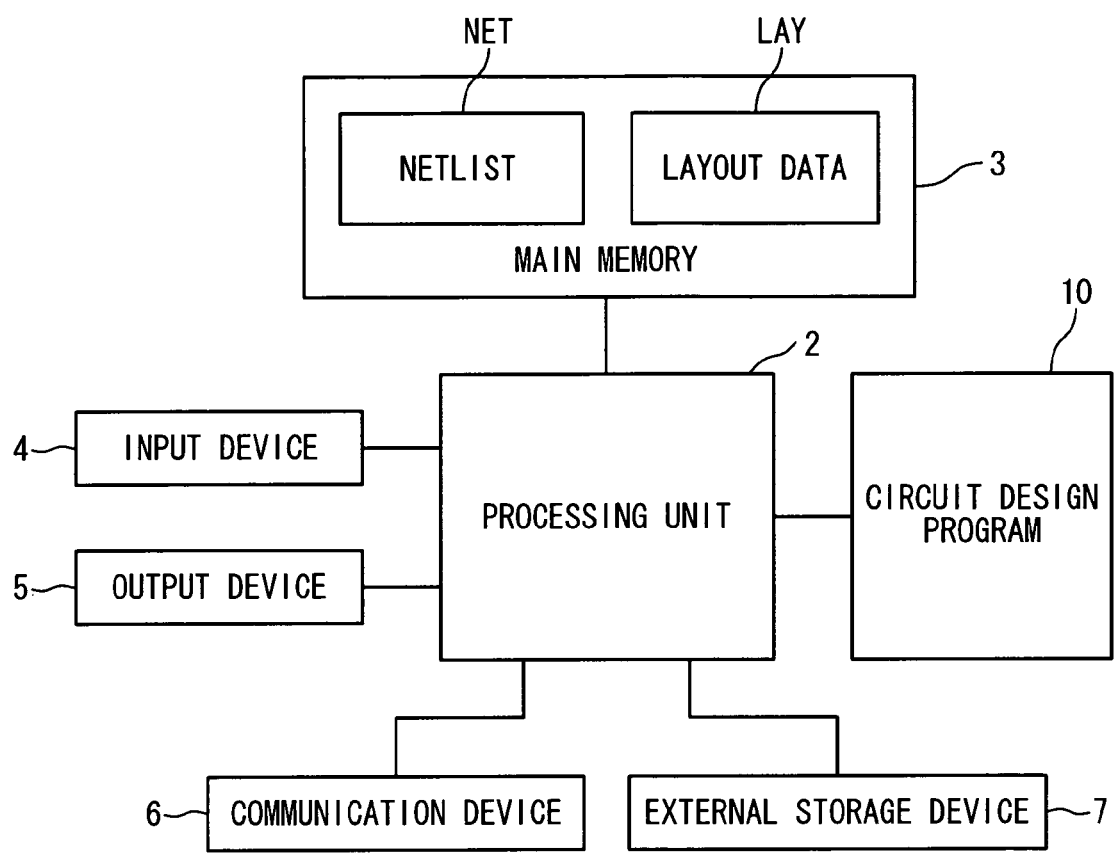
FIG. 26 is a block diagram showing an example of a computer-aided circuit design system according to the embodiments of the present invention.

The circuit design system according to the foregoing embodiments can be built on a computer. The circuit design system on the computer can be arbitrarily configured by a person having ordinary skill in the art. FIG. 26 shows an example of a configuration of the computer-aided circuit design system according to the present embodiments. The circuit design system 1 shown in FIG. 26 is provided with a processing unit 2, a main memory 3, an input device 4, an output device 5, a communication device 6, and an external storage device 7. In addition, the circuit design system 1 is provided with a circuit design program 10 that is a compute program executed by the processing unit 2.

The main memory 3 is, for example, a random access memory (RAM). The main memory 3 corresponds to the storage unit 103 mentioned above, and stores therein the netlist NET and the layout data LAY. The input device 4 is exemplified by a keyboard and a mouse. The input device 4 corresponds to the input unit 101 mentioned above. A user can input the netlist NET and edit data by using the input device 4. The output device 5 is exemplified by a display and a printer. The output device 5 corresponds to the output unit 117 mentioned above. The layout indicated by the layout data LAY is displayed on the display or output from the printer. The communication device 6 is, for example, a network interface card. The circuit design system 1 can communicate data with another computer system through the communication device 6. The external storage device 7 is, for example, a magnetic optical disk or a magnetic tape. The data can be input and output to and from the external storage device 7.

The circuit design program 10 is recorded in a computer-readable recording medium. The circuit design program 10 causes the computer to perform the circuit design processing described in the foregoing embodiments.

8. Conclusion

According to the circuit design system and the circuit design program of the present invention, the insertion position into which the observation point is inserted is optimized. As a result, the failure-analyticity is improved even with the small number of observation points inserted. In other words, it is possible to efficiently facilitate the failure analysis with fewer observation points. Furthermore, the present invention can be applied to the physical synthesis design method. That is, even in a case where the physical synthesis method is employed, it is possible to facilitate the failure analysis by inserting the observation point.

The present invention is used for improving the failure-analyticity of, for example, a CMOS logic circuit of a semiconductor integrated circuit. Moreover, the present invention can be applied to a logic circuit constituted by bipolar transistors, NMOS elements, compound semiconductor elements or the like. Furthermore, the present invention can be used for improving the failure-analyticity of a printed circuit board in which the number of interconnection layers has considerably increased in recent years, other than the semiconductor integrated circuit. Besides, the present invention can be applied to the failure-analyticity of all types of logical circuits such as an optical logic circuit using an optical switch element.

It is apparent that the present invention is not limited to the above embodiment and may be modified and changed without departing from the scope and spirit of the invention.

What is claimed is:

1. A circuit design system comprising:
 a storage unit in which a netlist is stored;
 a fault-candidate extracting module configured to extract equivalent fault class $G_1$ to $G_I$ (I is an integer equal to or greater than 1) from said netlist and to generate a fault-candidate data indicating said equivalent fault class $G_i$ (i is an integer not less than 1 and not greater than I), wherein said equivalent fault class $G_i$ is a portion of a design target circuit in which a fault position can not be specified by an external measurement and includes a plurality of nodes $N_{i1}$ to $N_{iJi}$ ($J_i$ is a number of nodes included in said equivalent fault class $G_i$);
 a judgment module configured to select a target node out of said plurality of nodes $N_{i1}$ to $N_{iJi}$ included in said equivalent fault class $G_i$ indicated by said fault-candidate data, wherein at least one observation point used for failure analysis is inserted into said target node; and
 an observation-point inserting module configured to update said netlist by inserting said at least one observation point into said target node,
 wherein said judgment module decides said target node based on said number $J_i$,
 a probability that a fault is included in said equivalent fault class $G_i$ is represented by $P_i$, a parameter $D_i$ with respect to said equivalent fault class $G_i$ is given by the following equation: $D_i = J_i \times P_i$, and a sum of said parameter $D_i$ with respect to all equivalent fault class is represented by M,
 said judgment module decides said target node such that said sum M is reduced due to said insertion of said observation point,
 a reduction rate of said sum M due to said insertion of said observation point takes a maximum value.

2. The circuit design system according to claim 1, wherein said judgment module selects said target node out of said plurality of nodes $N_{i1}$ to $N_{iJi}$ included in one equivalent fault class $G_i$ that has a maximum parameter $D_i$ among said equivalent fault class $G_1$ to $G_I$.

3. The circuit design system according to claim 2, wherein said one equivalent fault class $G_i$ is divided into a first equivalent fault class $G_{i-1}$ and a second equivalent fault class $G_{i-2}$ due to said insertion of said observation point,
 wherein said judgment module decides said target node such that said parameter $D_{i-1}$ with respect to said first equivalent fault class $G_{i-1}$ becomes closest to said parameter $D_{i-2}$ with respect to said second equivalent fault class $G_{i-2}$.

4. The circuit design system according to claim 1, wherein said judgment module selects said target node out of said plurality of nodes $N_{i1}$ to $N_{iJi}$ included in one equivalent fault class $G_i$ that has a maximum number $J_i$ among said equivalent fault class $G_1$ to $G_I$.

5. The circuit design system according to claim 1, wherein said judgment module selects said target node out of said plurality of nodes $N_{i1}$ to $N_{iJi}$ included in one equivalent fault class $G_i$ that has a maximum interconnection length among said equivalent fault class $G_1$ to $G_I$.

6. The circuit design system according to claim 1, wherein interconnection lengths of respective of said plurality of nodes $N_{i1}$ to $N_{i,Ji}$ are represented by $L_{i1}$ to $L_{i,Ji}$,
 wherein said judgment module calculates said probability $P_i$ as a value that depends on a sum of said interconnection lengths $L_{i1}$ to $L_{i,Ji}$ of said equivalent fault class $G_i$.

7. The circuit design system according to claim 1,
wherein said judgment module calculates said probability $P_i$ as a value that depends on said number $J_i$ of said equivalent fault class $G_i$.

8. The circuit design system according to claim 1, further comprising: a layout module configured to determine a layout of said design target circuit with reference to said netlist and to generate a layout data indicating said layout,
wherein said judgment module refers to said layout data and said fault-candidate data to calculate parameter $S_{1i}$ to $S_{Ki}$ respective of which indicate amounts of structures $X_1$ to $X_K$ (K is an integer equal to or greater than 1) in said equivalent fault class $G_i$, and calculates said probability $P_i$ based on said parameter $S_{ki}$ (k is an integer not less than 1 and not greater than K)

9. The circuit design system according to claim 1, further comprising a diagnosis-tree generating module configured to generate a diagnosis-tree data indicating a diagnosis-tree of said design target circuit by using said netlist and test patterns,
wherein said fault-candidate extracting module extracts said equivalent fault class $G_1$ to $G_I$ from said netlist by referring to said diagnosis-tree data.

10. The circuit design system according to claim 1,
wherein said design target circuit is designed based on a physical synthesis method.

11. The circuit design system according to claim 10, further comprising:
a logic synthesis module configured to generate a partial netlist by performing a logic synthesis of a RTL description of a part of said design target circuit and to store said partial netlist as said netlist in said storage unit;
a placing module configured to place cells included in said part of design target circuit with reference to said partial netlist and to generate a placement data indicating placement of said cells; and
a distance extracting module configured to extract an inter-cell distance based on said placement data and to generate a distance data indicating said intercell distance,
wherein interconnection lengths of respective of said plurality of nodes $N_{i1}$ to $N_{i,Ji}$ are represented by $L_{i1}$ to $L_{i,Ji}$,
wherein said judgment module sets interconnection length $L_{i,j}$ (j is an integer not less than 1 and not greater than $J_i$) to said inter-cell distance by referring to said distance data, and calculates said probability $P_i$ as a value that depends on a sum of said interconnection lengths $L_{i1}$ to $L_{i,Ji}$ of said equivalent fault class $G_i$.

12. The circuit design system according to claim 1,
wherein said target node is electrically connected to an external output terminal.

13. A computer readable recording medium with a computer program recorded thereon comprising code that, when executed, causes a computer to perform a circuit design procedures comprising:
(A) reading a netlist out of a storage unit;
(B) extracting equivalent fault class $G_1$ to $G_I$ (I is an integer equal to or greater than 1) from said netlist, wherein said equivalent fault class $G_i$ (i is an integer not less than 1 and not greater than I) is a portion of a design target circuit in which a fault position can not be specified by an external measurement and includes a plurality of nodes $N_{i1}$ to $N_{i,Ji}$ (J is a number of nodes included in said equivalent fault class $G_i$);
(C) selecting a target node out of said plurality of nodes $N_{i1}$ to $N_{i,Ji}$ included in said equivalent fault class $G_i$, wherein at least one observation point used for failure analysis is inserted into said target node; and
(D) updating said netlist by inserting said at least one observation point into said target node,
wherein in said (C) step, said target node is decided based on said number $J_i$,
a probability that a fault is included in said equivalent fault class $G_i$ is represented by $P_i$, a parameter $D_i$ with respect to said equivalent fault class $G_i$ is given by the following equation: $D_i = J_i \times P_i$, and a sum of said parameter $D_i$ with respect to all equivalent fault class is represented by M,
said (C) step includes: deciding said target node such that said sum M is reduced due to said insertion of said observation point, a reduction rate of said sum M due to said insertion of said observation point takes a maximum value.

14. The computer readable recording medium according to claim 13,
wherein in said (C) step, said target node is selected out of said plurality of nodes $N_{i1}$ to $N_{i,Ji}$ included in one equivalent fault class $G_i$ that has a maximum parameter $D_i$ among said equivalent fault class $G_1$ to $G_I$.

15. The computer readable recording medium according to claim 13,
wherein in said (C) step, said target node is selected out of said plurality of nodes $N_{i1}$ to $N_{i,Ji}$ included in one equivalent fault class $G_i$ that has a maximum number $J_i$ among said equivalent fault class $G_1$ to $G_I$.

16. The computer readable recording medium according to claim 13,
wherein in said (C) step, said target node is selected out of said plurality of nodes $N_{i1}$ to $N_{i,Ji}$ included in one equivalent fault class $G_i$ that has a maximum interconnection length among said equivalent fault class $G_1$ to $G_I$.

* * * * *